United States Patent
Crouse, Jr.

(10) Patent No.: US 11,462,918 B2
(45) Date of Patent: Oct. 4, 2022

(54) BATTERY SWITCH WITH CURRENT CONTROL

(71) Applicant: Aurora Flight Sciences Corporation, Manassas, VA (US)

(72) Inventor: Gilbert Lewis Crouse, Jr., Manassas, VA (US)

(73) Assignee: Aurora Flight Sciences Corporation, Manassas, VA (US)

( * ) Notice: Subject to any disclaimer, the term of this patent is extended or adjusted under 35 U.S.C. 154(b) by 786 days.

(21) Appl. No.: 16/283,092

(22) Filed: Feb. 22, 2019

(65) Prior Publication Data
US 2020/0274368 A1   Aug. 27, 2020

(51) Int. Cl.
*H02J 7/00* (2006.01)
*H02J 4/00* (2006.01)
(Continued)

(52) U.S. Cl.
CPC ........ *H02J 7/0021* (2013.01); *G01R 31/3842* (2019.01); *G01R 31/396* (2019.01);
(Continued)

(58) Field of Classification Search
CPC .... B60L 2200/10; B60L 3/0046; B60L 53/00; B60L 2240/547; B60L 2240/549;
(Continued)

(56) References Cited

U.S. PATENT DOCUMENTS

| 3,840,009 A | 10/1974 | Michaels et al. |
| 4,661,758 A | 4/1987 | Whittaker |

(Continued)

FOREIGN PATENT DOCUMENTS

| EP | 2 290 780 A1 | 3/2011 |
| WO | WO2011/149544 | 12/2011 |

(Continued)

OTHER PUBLICATIONS

Chung Steven et al: "Hybrid lead-acid/lithium-ion energy storage system with power-mix control for light electric vehicles", 2016 18th European Conference on Power Electronics and Applications (EPE'16 ECCE Europe), Jointly Owned by IEEE-PELS and EPE Association, Sep. 5, 2016 (Sep. 5, 2016), pp. 1-10, XP032985248, 001: 10.11 09/EPE.2016.7695531 [retrieved on Oct. 25, 2016].

(Continued)

*Primary Examiner* — Helen Rossoshek
(74) *Attorney, Agent, or Firm* — Michael Stanley Tomsa; McAndrews, Held & Malloy, Ltd.; Amanda C. Jackson

(57) ABSTRACT

The present disclosure relates to a multifunction battery switch and method of connecting a battery pack to an external bus via the multifunction battery switch. The multifunction battery switch having a multifunctional controller, a plurality of switches, an inductor, and a resistor. Each of the plurality of switches is independently controllable via switch commands from the multifunctional controller. The inductor, the resistor, and the plurality of switches are arranged to define a buck-boost converter to selectively regulate power transfer between the battery pack and the external bus as a function of the switch commands from the multifunctional controller.

16 Claims, 18 Drawing Sheets

(51) Int. Cl.
  *H02J 3/38* (2006.01)
  *H02M 3/158* (2006.01)
  *G01R 31/396* (2019.01)
  *G01R 31/3842* (2019.01)
  *H02J 7/35* (2006.01)
  *H02P 27/08* (2006.01)

(52) U.S. Cl.
  CPC ............... *H02J 3/385* (2013.01); *H02J 4/00* (2013.01); *H02J 7/35* (2013.01); *H02M 3/1582* (2013.01); *H02P 27/08* (2013.01)

(58) Field of Classification Search
  CPC ... B60L 58/16; H01M 10/441; H01M 10/482; H01M 2010/4271; H02J 2310/44; H02J 2007/0067; H02J 7/0018; H02J 7/0026; H02J 7/0029; H02J 7/007; H02J 7/00714; H02J 3/385
  See application file for complete search history.

(56) References Cited

U.S. PATENT DOCUMENTS

| | | | |
|---|---|---|---|
| 5,105,088 | A | 4/1992 | Boniface et al. |
| 5,670,272 | A | 9/1997 | Cheu et al. |
| 5,710,503 | A | 1/1998 | Sideris et al. |
| 5,810,284 | A | 9/1998 | Hibbs et al. |
| 6,040,085 | A | 3/2000 | Cheu et al. |
| 6,174,595 | B1 | 1/2001 | Sanders |
| 6,368,743 | B1 | 4/2002 | Guerin et al. |
| 6,430,692 | B1 | 8/2002 | Kimble et al. |
| 6,624,535 | B2 | 9/2003 | Morrow |
| 7,075,194 | B2 | 7/2006 | Weidenheimer et al. |
| 8,356,770 | B2 | 1/2013 | Parks |
| 8,427,113 | B2 * | 4/2013 | Xing ............ H02J 7/00711 320/145 |
| 8,507,125 | B2 | 8/2013 | Meschter |
| 8,937,254 | B2 | 1/2015 | Wen et al. |
| 9,054,361 | B2 | 6/2015 | Christian et al. |
| 9,197,081 | B2 | 11/2015 | Finberg et al. |
| 9,425,631 | B2 * | 8/2016 | Furtner ............ H02J 7/0019 |
| 9,478,836 | B2 | 10/2016 | Albertus et al. |
| 9,525,290 | B2 | 12/2016 | Synder |
| 9,531,039 | B2 | 12/2016 | Heubner et al. |
| 9,705,156 | B2 | 7/2017 | Dorsch |
| 10,442,309 | B2 * | 10/2019 | Goetz ............ H02J 7/1423 |
| 11,108,251 | B2 * | 8/2021 | Kirleis ............ B64C 39/024 |
| 2007/0062744 | A1 | 3/2007 | Weidenheimer et al. |
| 2008/0143292 | A1 | 6/2008 | Ward |
| 2008/0213659 | A1 | 9/2008 | Yamada |
| 2008/0215200 | A1 | 9/2008 | Toth |
| 2009/0033293 | A1 * | 2/2009 | Xing ............ H02J 7/02 323/284 |
| 2009/0085553 | A1 | 4/2009 | Kumar et al. |
| 2010/0213887 | A1 | 8/2010 | Louch |
| 2010/0216016 | A1 | 8/2010 | Seino et al. |
| 2010/0261043 | A1 | 10/2010 | Kim et al. |
| 2010/0261048 | A1 | 10/2010 | Kim et al. |
| 2010/0266875 | A1 * | 10/2010 | Somogye ............ G05F 1/10 429/7 |
| 2010/0305792 | A1 | 12/2010 | Wilk et al. |
| 2011/0025258 | A1 | 2/2011 | Kim et al. |
| 2011/0057617 | A1 | 3/2011 | Finberg et al. |
| 2012/0103714 | A1 | 5/2012 | Choi et al. |
| 2012/0133310 | A1 | 5/2012 | Lee |
| 2013/0181661 | A1 | 7/2013 | Workman et al. |
| 2013/0330577 | A1 | 12/2013 | Kristofek et al. |
| 2014/0061376 | A1 | 3/2014 | Fisher et al. |
| 2014/0248520 | A1 | 9/2014 | Ward et al. |
| 2014/0312828 | A1 | 10/2014 | Vo et al. |
| 2015/0048783 | A1 | 2/2015 | Albertus et al. |
| 2015/0236315 | A1 | 8/2015 | Hofer et al. |
| 2016/0261127 | A1 * | 9/2016 | Worry ............ H01M 10/425 |
| 2016/0311545 | A1 | 10/2016 | Parks et al. |
| 2017/0102437 | A1 * | 4/2017 | Singh ............ G01R 31/42 |
| 2017/0331323 | A1 | 5/2017 | Ehrmantraut et al. |
| 2017/0163160 | A1 * | 6/2017 | Din ............ H02J 7/0016 |
| 2018/0241236 | A1 * | 8/2018 | Vasefi ............ H01M 10/482 |

FOREIGN PATENT DOCUMENTS

| | | |
|---|---|---|
| WO | 2013/119367 A1 | 8/2013 |
| WO | WO2015/012769 | 1/2015 |
| WO | 2017/106535 A1 | 6/2017 |

OTHER PUBLICATIONS

Extended European search report for Application No. 120158677.3, dated Apr. 29, 2020, pp. 1-12, European Patent Office, Germany.

Merrit, Bernard T., et al., Halbach Arrah Motor/Generators—A Novel Generalized Electric Machine, Halbach Festschrift Symposium, Berkeley, CA; Feb. 3, 1995.

Murnane, Martin, et al., A Closer Look at State of Charge (SOC) and State of Health (SOH) Estimation Techniques for Batteries, © 2017 Analog Devices, Inc.

Linear Technology LTC2439-1, 8-/16-Channel 16-Bit No Latency ΔΣ™ ADC, LT 0915 Rev B, © Linear Technology Corporation 2005.

Microchip MCP23017/MCP23S17 16-Bit I/O Expander with Serial Interface, DS20001952C, © 2005-2016 Microchip Technology Inc.

Linear Technology LTM8048, 3.1 VIN to 32 VIN Isolated μModule DC/DC Converter with LDO Post Regulator, LT 0715 Rev G, © Linear Technology Corporation 2011.

Analog Devices Micropower Quad-Channel Digital Isolators Data Sheet ADuM1440/ADuM1441/ADuM1442/ADuM1445/ADuM1446/ADuM1447 © 2013-2017 Analog Devices, Inc.

International Search Report and Written Opinion, dated Aug. 16, 2017, in International application No. PCT/US2017/032373, filed May 12, 2017.

European Examination report for application No. 120158677.3, dated Dec. 15, 2021, pp. 1-7, European Patent Office, Germany (7 pages).

* cited by examiner

BATTERY SWITCH WITH CURRENT CONTROL

FIELD

The present disclosure relates to battery power systems and methods, such as those suitable for use with aircraft.

BACKGROUND

The concept of high-altitude, long-endurance, solar-powered aircraft has been demonstrated by a number of aerial vehicle research projects. Solar power systems typically rely on an array of solar panels that interface with a battery grid (or similar battery systems) through control circuitry, such as a maximum power point (MPP) tracker.

An MPP tracker provides a circuit assembly that, in operation, adjusts the load impedance presented to the array of solar panels to achieve a maximum power out of the solar array. The power collected out of the solar array is then stored to the battery packs/assemblies of the battery grid. A maximum power point (MPP) tracker and other battery power systems, however, introduce additional weight and complexity to the overall system.

A need exists for solar and battery power systems and methods that can overcome the deficiencies of the prior art. Such a lightweight, efficient battery packs and battery pack assemblies may be employed with ultralight aircraft applications, such as long endurance solar-powered aircraft.

SUMMARY

The present disclosure relates to battery power systems and methods, such as those suitable for use with aircraft.

According to a first aspect, a method is provided for selectively connecting a battery pack to an external bus with a multifunction battery switch, the multifunction battery switch comprising a multifunctional controller operatively coupled with a plurality of switches that are arranged with a resistor and an inductor to define a buck-boost converter, the method comprising: measuring a current through the resistor to yield a current measurement; measuring a voltage across the battery pack to yield a battery voltage measurement; measuring a voltage across the external bus to yield a bus voltage measurement; calculating a differential voltage measurement between the battery voltage measurement and the bus voltage measurement; generating, via the multifunctional controller, one or more switch commands as a function of the current measurement, the battery voltage measurement, the bus voltage measurement, and the differential voltage measurement; and independently controlling each of the plurality of switches via the switch commands to regulate power transfer between the battery pack and the external bus.

In certain aspects, the one or more switch commands are configured to control the plurality of switches to facilitate charge-only operation and discharge-only operation.

In certain aspects, the method further comprises the step of modulating the one or more switch commands using at least one pulse width modulation (PWM) control technique to implement step-up or step-down voltage adjustments to the power transfer.

In certain aspects, the method further comprises the step of controlling at least one of the plurality of switches to operate as an ideal diode (1) to prevent current flow into the battery pack during discharge-only operation and (2) to prevent current flow out of the battery pack during charge-only operation.

In certain aspects, the battery pack is a reconfigurable battery pack having a plurality of switchable battery modules that are electrically arranged in series to define a battery string defining an output voltage, each of the plurality of switchable battery modules including a battery cell and a battery switch, wherein the battery switch is configured to (1) electrically connect the battery cell to the battery string to increase the output voltage when the battery switch is in a first position, and (2) electrically bypass the battery cell from the battery string when the battery switch is in a second position.

In certain aspects, the method further comprises the steps of: generating, via the multifunctional controller, switch commands to implement fine adjustments to the output voltage of the reconfigurable battery pack via the plurality of switches; and controlling the battery switch to implement coarse adjustments to the output voltage of the reconfigurable battery pack via the plurality of switchable battery modules.

According to a second aspect, a multifunction battery switch for selectively connecting a battery pack to an external bus, the multifunction battery switch comprises: a multifunctional controller; a plurality of switches, wherein each of the plurality of switches is independently controllable via switch commands from the multifunctional controller; an inductor; and a resistor, wherein the inductor, the resistor, and the plurality of switches are arranged to define a buck-boost converter to selectively regulate power transfer between the battery pack and the external bus as a function of the switch commands from the multifunctional controller.

In certain aspects, the multifunctional controller is configured to control the plurality of switches to facilitate charge-only operation and discharge-only operation.

In certain aspects, the multifunctional controller is configured to control at least one of the plurality of switches using one or more pulse width modulation (PWM) control techniques to implement step-up or step-down voltage adjustments to the power transfer.

In certain aspects, the multifunctional controller is configured to control at least one of the plurality of switches to operate as an ideal diode.

In certain aspects, the multifunctional controller is configured to control at least one of the plurality of switches to operate as an ideal diode to prevent current flow into the battery pack during discharge-only operation.

In certain aspects, the multifunctional controller is configured to control at least one of the plurality of switches to operate as an ideal diode to prevent current flow out of the battery pack during charge-only operation.

In certain aspects, the plurality of switches comprises a first switch, a second switch, a third switch, and a fourth switch.

In certain aspects, the first switch is configured to pass current between a first inductor terminal of the inductor and a first battery terminal of the battery pack and the second switch is configured to pass current between the first inductor terminal of the inductor and a second battery terminal of the battery pack.

In certain aspects, the third switch is configured to pass current between a second inductor terminal of the inductor and a first bus terminal of the external bus and the fourth switch is configured to pass current between the second inductor terminal of the inductor and a second bus terminal of the external bus.

In certain aspects, the multifunction battery switch further comprises an amplifier to output (1) a current measurement through the resistor or (2) a voltage measurement across the resistor.

In certain aspects, the multifunction battery switch further comprises an amplifier to output a differential voltage measurement between (1) a battery voltage across the battery pack and (2) a bus voltage across the external bus.

In certain aspects, the multifunctional controller is configured to generate the switch commands as a function of the current measurement, the voltage measurement, or the differential voltage measurement.

In certain aspects, the battery pack is a reconfigurable battery pack having a plurality of switchable battery modules that are electrically arranged in series to define a battery string having a variable output voltage.

In certain aspects, the multifunctional controller controls the plurality of switches of the buck-boost converter to implement fine adjustments to the variable output voltage of the reconfigurable battery pack.

DRAWINGS

The foregoing and other objects, features, and advantages of the devices, systems, and methods described herein will be apparent from the following description of particular embodiments thereof, as illustrated in the accompanying figures; where like reference numbers refer to like structures. The figures are not necessarily to scale, emphasis instead being placed upon illustrating the principles of the devices, systems, and methods described herein.

DESCRIPTION

Figure 1A:
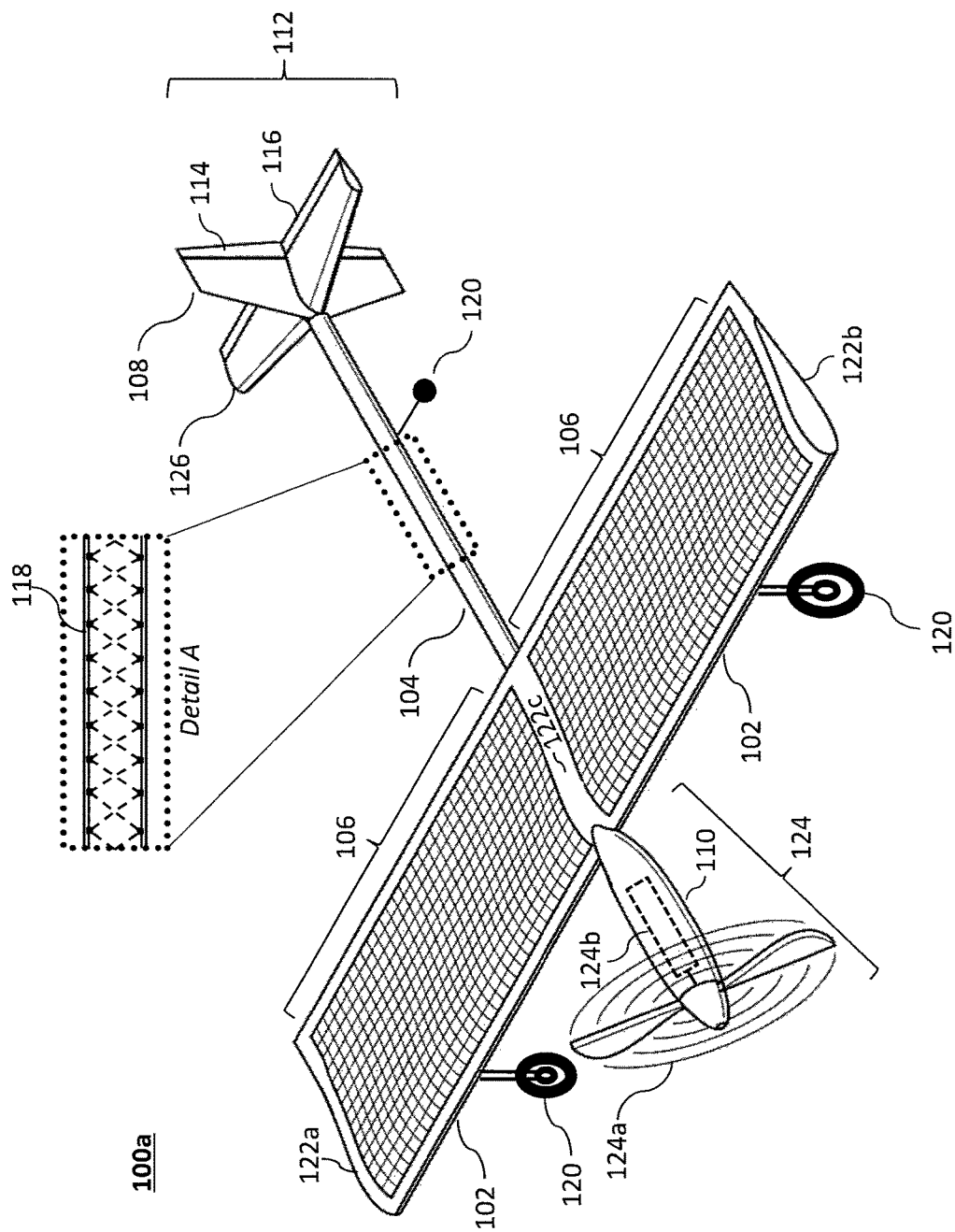
FIG. 1a illustrates an example solar-powered aircraft in accordance with a first aspect.

References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context. Recitation of ranges of values herein are not intended to be limiting, referring instead individually to any and all values falling within the range, unless otherwise indicated herein, and each separate value within such a range is incorporated into the specification as if it were individually recited herein. In the following description, it is understood that terms such as "first," "second," "top," "bottom," "side," "front," "back," and the like are words of convenience and are not to be construed as limiting terms.

As used herein, the terms "about," "approximately," "substantially," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. The terms "e.g.," and "for example" set off lists of one or more non-limiting examples, instances, or illustrations. No language in the specification should be construed as indicating any unclaimed element as essential to the practice of the embodiments.

As used herein, the terms "circuits" and "circuitry" refer to physical electronic components (i.e., hardware) and any software and/or firmware ("code"), which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code.

As used herein, the terms "aerial vehicle" and "aircraft" are used interchangeably and refer to a machine capable of flight, including, but not limited to, both traditional runway and vertical takeoff and landing ("VTOL") aircraft, and also including both manned and unmanned aerial vehicles ("UAV"). VTOL aircraft may include fixed-wing aircraft (e.g., Harrier jets), rotorcraft (e.g., helicopters, multirotor, etc.), and/or tilt-rotor/tilt-wing aircraft.

As used herein, the term "and/or" means any one or more of the items in the list joined by "and/or." As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y, and/or z" means "one or more of x, y, and z."

As used herein, the term "composite material" as used herein, refers to a material comprising an additive material and a matrix material. For example, a composite material may comprise a fibrous additive material (e.g., fiberglass, glass fiber ("GF"), carbon fiber ("CF"), aramid/para-aramid synthetic fibers, etc.) and a matrix material (e.g., epoxies, polyimides, and alumina, including, without limitation, thermoplastic, polyester resin, polycarbonate thermoplastic, casting resin, polymer resin, acrylic, chemical resin). In certain aspects, the composite material may employ a metal, such as aluminum and titanium, to produce fiber metal laminate (FML) and glass laminate aluminum reinforced epoxy (GLARE). Further, composite materials may include hybrid composite materials, which are achieved via the addition of some complementary materials (e.g., two or more fiber materials) to the basic fiber/epoxy matrix.

As used herein, the term "composite laminates" as used herein, refers to a type of composite material assembled from layers (i.e., a "ply") of additive material and a matrix material.

As used herein, the terms "communicate" and "communicating" refer to (1) transmitting, or otherwise conveying, data from a source to a destination, and/or (2) delivering data to a communications medium, system, channel, network, device, wire, cable, fiber, circuit, and/or link to be conveyed to a destination.

As used herein, the term "processor" means processing devices, apparatuses, programs, circuits, components, systems, and subsystems, whether implemented in hardware, tangibly embodied software, or both, and whether or not it is programmable. The term "processor" as used herein includes, but is not limited to, one or more computing devices, hardwired circuits, signal-modifying devices and systems, devices and machines for controlling systems, central processing units, programmable devices and systems, field-programmable gate arrays, application-specific integrated circuits, systems on a chip, systems comprising discrete elements and/or circuits, state machines, virtual machines, data processors, processing facilities, and combinations of any of the foregoing. The processor may be, for example, any type of general purpose microprocessor or microcontroller, a digital signal processing (DSP) processor, an application-specific integrated circuit (ASIC). The processor may be coupled to, or integrated with a memory device. The memory device can be any suitable type of computer memory or any other type of electronic storage medium, such as, for example, read-only memory (ROM), random access memory (RAM), cache memory, compact disc read-only memory (CDROM), electro-optical memory, magneto-optical memory, programmable read-only memory (PROM), erasable programmable read-only memory (EPROM), electrically-erasable programmable read-only memory (EEPROM), a computer-readable medium, or the like.

As used herein, the term "solar panel" refers to an array of one or more photovoltaic cells configured to collect solar energy to generate electrical power. The solar panels may employ one or more of the following solar cell types: monocrystalline silicon solar cells, polycrystalline silicon solar cells, string ribbon solar cells, thin-film solar cells (TFSC), cadmium telluride (CdTe) solar cells, copper indium gallium selenide (CIS/CIGS) solar cells, and the like. To reduce overall weight and to improve reliability and durability, it is advantageous to employ light weight and/or flexible solar panels (e.g., thin-film solar panels).

As used herein, circuitry or a device is "operable" to perform a function whenever the circuitry or device comprises the necessary hardware and code (if any is necessary) to perform the function, regardless of whether performance of the function is disabled, or not enabled (e.g., by a user-configurable setting, factory trim, etc.).

Figure 1B:
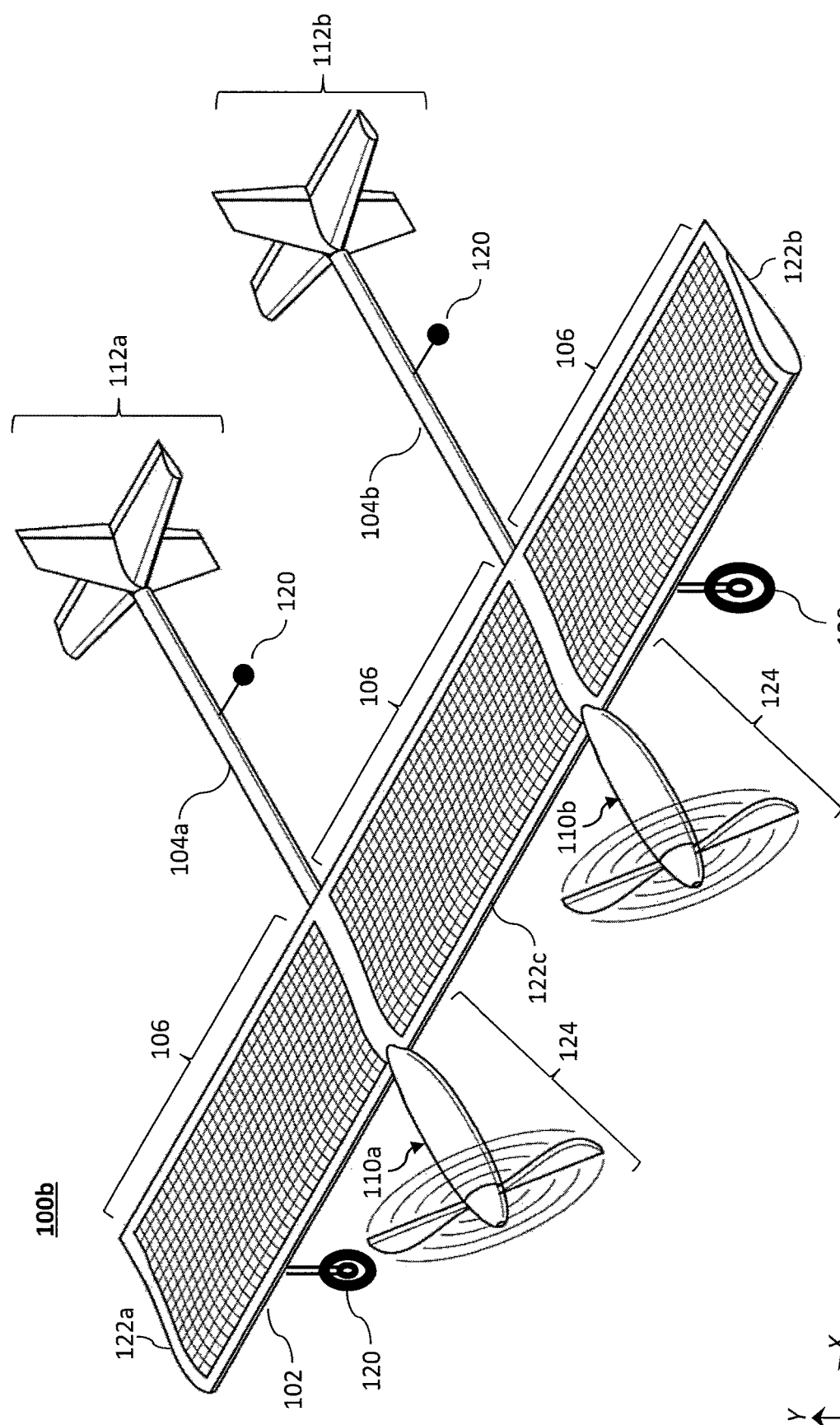
FIG. 1b illustrates an example solar-powered aircraft in accordance with a second aspect.

FIGS. 1a and 1b illustrate example solar-powered aircraft 100a, 100b. Specifically, FIG. 1a illustrates an isometric view of a first solar-powered aircraft 100a with a single fuselage 110 and tail boom 104, while FIG. 1b illustrates an isometric view of a second solar-powered aircraft 100b with a set of two side-by-side fuselages 110a, 110b and a set of two side-by-side first and second tail booms 104a, 104b. As illustrated, each of the two side-by-side fuselages 110a, 110b may include a propulsor 124. The solar-powered aircraft 100a, 100b generally comprises a wing 102, one or more propulsors 124 (e.g., a propeller 124a and associated gearing, which is axially driven by one or more motors 124b), one or more fuselages 110 (e.g., a single fuselage 110 or a set of fuselages 110a, 110b), one or more tail booms 104 (e.g., a single tail boom 104 or a set of tail booms 104a, 104b; each illustrated as an elongated boom coupled to the aft end of a fuselage 110), one or more tail sections 112 (e.g., a single tail section 112 or a set of tail sections 112a, 112b), and landing gear 120. As illustrated, the wing 102 comprises a first wing tip 122a (port side), a second wing tip 122b (starboard side), and a midpoint 122c along the wing's 102 wingspan that is approximately half way between the first wing tip 122a and the second wing tip 122b.

The various structural components of the solar-powered aircraft 100a, 100b may be fabricated from metal, a composite material, or a combination thereof. For example, portions of the wing 102 may be fabricated using fused deposition modeling (FDM), stereolithography (SLA), selective laser sintering (SLS), and/or any other suitable type of additive manufacturing/3D printing. A benefit of this fabrication method is that it produces a high-performing, more stable aircraft, using advanced sensing and 3D printing disciplines. FDM is a thermal polymer layer deposition process that produces components one layer at a time, effectively printing aircraft components rapidly, in low-volume, and to exacting material specifications. Using FDM, numerous wing design iterations may be inexpensively manufactured to meet desired strength and stiffness requirements, control surface sizing, and other characteristics. Further, additional wing panels/components may be fabricated to allow for tailored sensor integration, ease of generating additional actuation schemes or altering the control surface placement, ease of characterizing the strain on the wing, and an ability to easily alter the wing's stiffness to provide the best platform for proprioceptive sensing in a given application. This capability also offers robustness against wing damage, as replacement components are readily reproducible.

Each propulsor 124 generally comprises a motor 124b coupled to, and configured to drive/rotate, a propeller 124a. The motor 124b may be an electric motor controlled via a motor controller 306, such as an electronic speed controller (ESC) unit. To that end, an ESC unit (or another motor controller 306) may be provided to control the motor 124b, which may be coupled (or otherwise integrated) with the wing 102 (e.g., as part of a nacelle pod). The propulsor 124 may be positioned on the wing 102, the tail boom 104 (e.g., at the proximal end), or a combination thereof. For example, each of the propulsors 124 may be positioned on, or within, the wing 102 in either a pusher configuration or a tractor configuration (as illustrated). Further, while each fuselage 110 is illustrated as having a single propulsor 124 associated therewith, additional propulsors 124 may be provided. Regardless of the propulsion configuration, each of the plurality of propulsors 124 may be oriented to direct thrust toward the distal end of the tail boom 104 (aft).

The wing 102 and/or the horizontal stabilizer 126 may comprise one or more arrays of solar panels 106 to generate power. As illustrated in FIG. 1a, the solar panels 106 may be positioned on each side of the tail boom 104/fuselage 110 along the upper surface of the wing 102. The solar-powered aircraft 100a, 100b may further comprise one or more energy storage devices operatively coupled to the solar panels 106 to power the vehicle management system 218 and various electric loads. The one or more energy storage devices store collected solar energy for later use by the solar-powered aircraft 100a, 100b (e.g., when sunlight is unavailable, typically at nighttime). As used herein "energy storage device" refers to a battery or similar instrumentality known to those of skill in the art capable of storing and transmitting energy collected from the solar panels 106, including but not limited to a rechargeable battery (e.g., lithium-polymer batteries), a regenerative fuel cell, or combinations thereof.

While the wing 102 is illustrated as generally linear with non-tapered outboard portions, other configurations are contemplated, such as back-swept, tapered, rectangular, elliptical, forward-swept, and the like. Therefore, the wing 102 may be any type of fixed wing, including, but not limited to, a straight wing, a swept wing, a forward-swept wing, a dihedral wing (an upward angle from horizontal), an anhedral wing (a negative dihedral angle—downward angle from horizontal), or any other suitable type of fixed wing as known by those of ordinary skill in the art. As illustrated, the wingspan of the wing 102 may be substantially perpendicular relative to the longitudinal length of the fuselage(s) 110 and tail boom(s) 104; however, the wing 102 may instead be swept back or swept forward. In certain aspects, the wing 102 may be modular and configured for disassembly; thereby allowing the solar-powered aircraft 100a, 100b to be more easily transported by land and/or to physically fit within a hanger or other structure for storage. For example, the wing 102 may be fabricated from a plurality of wing panel modules and removably joined to one another end-to-end via a set of joints. Each of the joints may employ one or more fasteners (e.g., bolts, clips, etc.) and electrical connectors (e.g., plugs, contacts, etc.) to facilitate both physical and electrical coupling therebetween.

As can be appreciated, control surfaces on the wing typically require additional structural reinforcements and actuators, which result in additional weight. In addition, adding control surfaces to a wing increases the drag during flight. Further, control surfaces on a wing can also require that the skin panel be broken into sections, as opposed to having a substantially unbroken construction that allows for the solar panels 106 to cover more of the upper surface of the wing 102. Finally, manufacturing control surfaces adds complexity as attachment mechanisms, hinges, additional parts, and/or multiple skin panels must be made. Removing the control surfaces, however, eliminates these complexities. Therefore, unlike traditional aircraft, the wing 102 need not include movable control surfaces (e.g., flaps, slats, etc.) along the trailing or leading edges of its wingspan. Indeed, to reduce weight and complexity, the wing 102 may be generally devoid of movable control surfaces. For example, the upper and lower surface of the wing 102 may be fabricated as a single piece structure without any moving parts. Control of the wing 102 may instead be achieved through control surfaces positioned on one or more of the tail sections 112 positioned at the distal end of each tail boom 104.

The solar-powered aircraft 100a, 100b may employ one or more tail booms 104. In one aspect, a single tail boom 104 (see FIG. 1a) or in other aspects, multiple tail booms, for example, a first tail boom 104a and a second tail boom 104b (see FIG. 1b). Regardless of configuration, each tail boom 104 defines a proximal end and a distal end, where each of the tail booms 104 may be secured at its proximal end to a fuselage 110 or a wing 102, while being coupled to a tail section 112 at its distal end. The solar-powered aircraft 100a, 100b (e.g., the tail booms 104, fuselages 110, etc.) may be fabricated using a tubular core structure 118, which may then be covered with aircraft skin (e.g., composite materials, fabric, metal, metals alloys, etc.). Detail A of FIG. 1a best illustrates the tubular core structure 118, where the aircraft skin has been removed for clarity. In certain aspects, the tail boom 104 and the fuselage 110 may be fabricated as a single, unitary component. While the solar-powered aircraft 100b is illustrated as having two fuselages 110 and two tail booms 104, a person of skill in the art would understand that additional, or fewer, fuselages 110/tail booms 104 may be employed to achieve a desired function and as a function of, for example, the length of the wing 102.

To facilitate takeoff and landing, the solar-powered aircraft 100a, 100b may be provided with one or more sets of landing gear 120, which may be positioned on the undercarriage of the aerial vehicle. For example, a set of landing gear 120 may be provided at the underside of the wing 102, fuselage 110, and/or tail boom 104. The landing gear 120 may employ, inter alia, a set of wheels (as illustrated) and/or skids. In operation, the landing gear 120 serves to support the solar-powered aircraft 100a, 100b when it is not flying; thereby allowing it to take off, land, and taxi without causing damage to the airframe.

As illustrated, each tail section 112 may comprise one or more one control surfaces to move/steer the tail section 112 in a desired direction. For example, each tail section 112 may comprise a vertical stabilizer 108 (e.g., a dorsal fin) extending vertically (above and/or below) from the tail boom 104, a rudder 114 operatively coupled to the vertical stabilizer 108, a horizontal stabilizer 126 extending laterally from either side of the tail boom 104, and an elevator 116 (or portion thereof) operatively coupled to each side of the horizontal stabilizer 126. The tail sections 112 of the solar-powered aircraft 100a, 100b may be selectively controlled (e.g., via a flight controller/vehicle management system 218) to control the overall pitch, roll, and yaw of the solar-powered aircraft 100a, 100b, thereby obviating the need for movable control surface on the wing 102. The elevators 116 may be used to change the pitch of the tail section 112, while the rudder 114 may be used to change the yaw of the tail section 112. The pitch and/or yaw of the tail sections 112 may be separately controlled via the rudders 114 and/or elevators 116 to create a local force moment at the location the tail boom 104 attaches to the wing 102.

Each rudder 114 may be rotatably and/or hingedly coupled to a vertical stabilizer 108 via one or more hinges to enable the rudder 114 to move about an axis defined by the vertical stabilizer 108 at its trailing edge. Similarly, the elevators 116 may be rotatably and/or hingedly coupled to the horizontal stabilizer 126 via one or more hinges to enable movement about an axis defined by the horizontal stabilizer 126 at its trailing edge. In certain aspects, one or more of the rudders 114 and/or the elevators 116 may additionally be configured with a mechanism (e.g., rails, tracks, etc.) to allow for other, non-rotatable movement, such as, for example, sliding and/or lateral movement relative to the vertical or horizontal stabilizer. In alternative embodiments, one or more of the rudders 114 and/or the elevators 116 may be omitted entirely from a given tail section 112. Depending on the desired tail configuration, the horizontal stabilizer 126 and vertical stabilizers 108 may be operatively coupled to one another as well as the tail booms 104, or operatively coupled only to the tail booms 104. The tail section 112 may be configured in one of multiple tail configurations, including, for example, fuselage mounted, a cruciform, T-tail, a flying tailplane, a pi-tail (i.e., π-tail), a V configuration, an inverted V configuration (i.e., "Λ" configuration), a twin tail (H-tail arrangement or U-tail arrangement), etc. Further, the horizontal stabilizer 126 may be straight, back-swept, tapered, rectangular, elliptical, forward-swept, etc. In certain aspects, the tail section 112 may employ a combination H- and Λ-tail arrangement where the tail section 112 comprises Λ-tail surfaces that couple to the horizontal stabilizer 126 to provide a combination H- and Λ-tail arrangement.

Persons of ordinary skill in the art will recognize that alternative and/or additional structural arrangements may be implemented to accommodate the design and/or operational requirements of the tail section 112. For example, the tail section 112 may instead employ only one or more vertical stabilizer 108, one or more horizontal stabilizer 126, and/or slanted or offset stabilizers that have both horizontal and vertical dimensions. Additionally, or alternatively, the tail section 112 may include multiple rudders 114 on the vertical stabilizer 108 and/or a plurality of elevators 116 on each side of the horizontal stabilizer 126.

Figure 2:
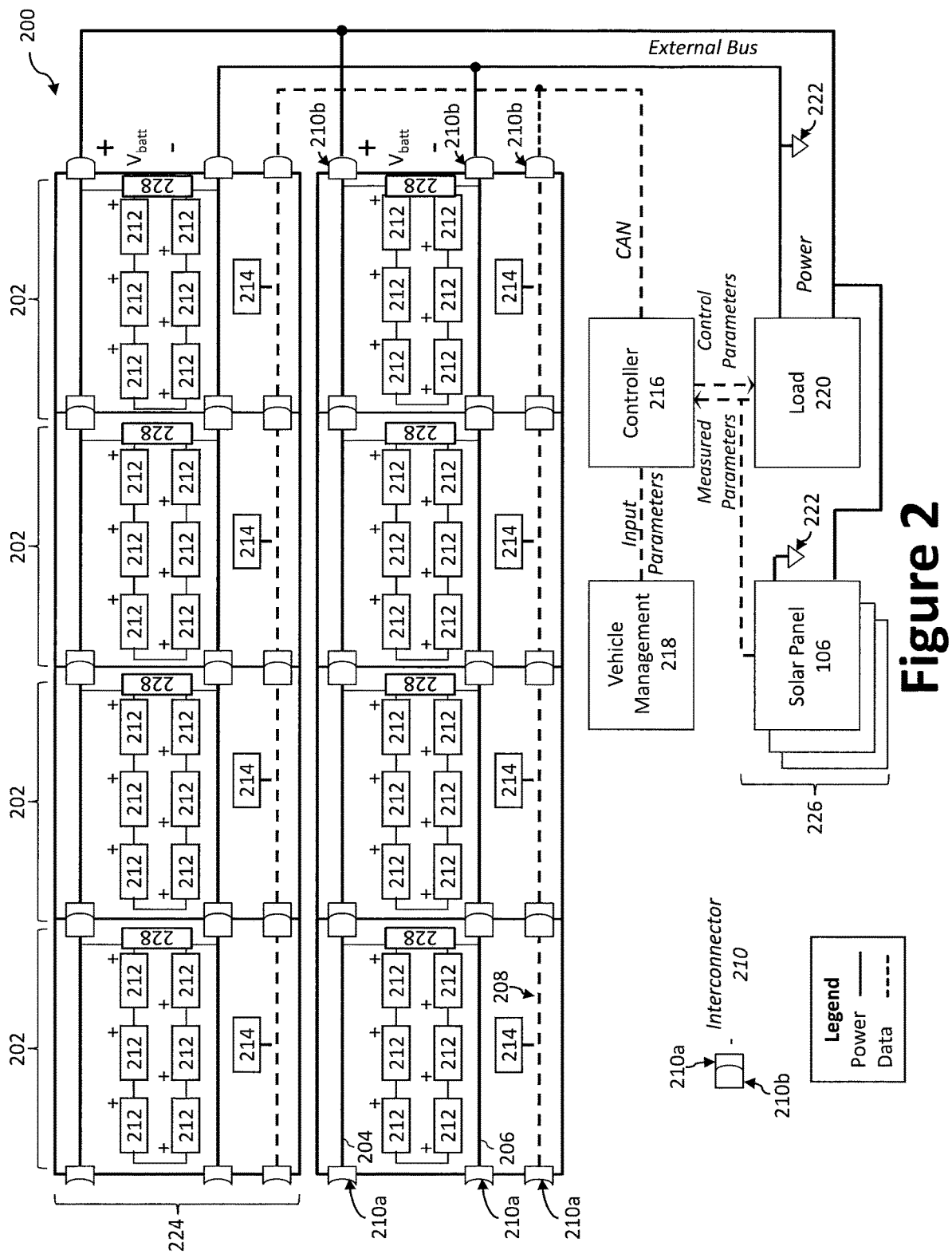
FIG. 2 illustrates an example solar power system having a battery array.

The solar-powered aircraft 100a, 100b may employ a vehicle management system 218 operable to control the various functions of the solar-powered aircraft 100a, 100b. As illustrated in FIG. 2, the solar-powered aircraft 100a, 100b may be equipped with one or more battery arrays 200 to supply power to the various electric loads 220. The electric load 220 may include, for example, one or more payloads (e.g., an intelligence surveillance reconnaissance (ISR) payload), one or more motors (e.g., the motors 124b used in connection with the propulsors 124), actuators (e.g., to control the flight control surfaces of the tail section 112, landing gear 120, and the like), etc. Each battery array 200 generally comprises one or more battery banks 224, each battery bank 224 having a plurality of battery pack assemblies 202 electrically coupled to each other; thereby defining, along its longitudinal length, a power supply line 204, a ground line 206, and, where desirable, a data communication line 208. The ground line 206 may be electrically coupled to an equipotential point 222 (e.g., ground). As illustrated, the battery pack assemblies 202 within a battery bank 224 may be arranged electrically in parallel. The data communication line 208 may be shielded so as to mitigate electromagnetic interference (EMI) for, inter alia, the power supply line 204. The data communication line 208 may be coupled to one or more sensors or devices 214 that monitor or control, for example, the health and/or operating parameters (e.g., temperature, humidity, voltage, etc.) of each battery pack assembly 202 or battery pack 212.

The battery pack assemblies 202 within a battery bank 224 may be electrically connected to one another via one or more interconnectors 210 to facilitate the passing of power and/or data signals from one battery pack assembly 202 to another battery pack assembly 202 (e.g., an adjacent battery pack assembly 202). The interconnectors 210 may employ, for example, a first connector 210a (e.g., a female connector) and a second connector 210b (e.g., a male connector) configured to mate with one another. For example, when arranged in a row/string, power and/or data signals may be conveyed, or otherwise communicated, from one end (e.g., proximal end) of a battery array 200 to an opposite end (e.g., distal end) of the battery array 200 via the interconnectors 210; each of which can provide pass through functionality in the event of an isolated battery pack assembly 202 failure. For instance, the battery pack assemblies 202 can integrate the power rails (e.g., power supply line 204, ground line 206) and data communication lines 208 with in-line connections such that battery pack assemblies 202 can be attached to one another to form continuous power and data pathways for feeding the load and interacting with the system controller 216. Each of the battery pack assemblies 202 may be selectively switched online (connected) to or switched offline (disconnected) from the battery bank 224 via one or more switching units 228 (e.g., relays, solid-state switches, etc.). For example, in the event of failure/malfunction or to achieve a desired power/capacity.

In certain aspects, a battery bank 224 within the battery array 200 can be expanded and contracted as needed (e.g., additional battery pack assemblies 202 may be connected or disconnected). In other words, power and/or data signals are carried across the battery bank 224, thereby only requiring an electrical connection at one end of the battery bank 224. Consequently, an energy storage system having such battery banks 224 provide for quick electrical and mechanical integration. Further, the battery pack assemblies 202 may be fabricated in bulk, thereby obviating the need for costly, complicated, and potentially unreliable harnesses. In operation, the system controller 216, which may be processor-controlled, monitors each of the one or more battery arrays 200 (and separately, each battery bank 224, battery pack assembly 202, or battery cells 772), the one or more solar panels 106 (e.g., a solar array 226 composed of at least two solar panels 106), and the one or more electric loads 220. For instance, in response to an input parameter (e.g., an instruction from the solar-powered aircraft's 100 vehicle management system 218), the system controller 216 may adjust the electric load 220 and/or adjust (or reallocate) power from the one or more battery arrays 200 to meet the electric load's 220 needs. To that end, the system controller 216 may incorporate, or be operatively coupled with, a plurality of battery pack controllers. The system controller 216 may communicate through either a simplex or redundant communications bus to each of the battery pack assemblies 202 in an energy storage system (e.g., battery array 200 or battery bank 224). The system controller 216 may employ one or more control area network (CAN) buses for monitoring, communication, and/or control, while an external bus may be used to transfer power between the battery bank(s) 224 (or components thereof) and the electric load 220 or solar array 226. In certain aspects, as will be discussed below, the battery array 200 may employ a power allocation switching unit system and/or algorithm for managing battery groups and solar panels, such as an array consolidation and switching unit (ACSU).

The battery array 200, whether composed of a single battery bank 224 or multiple battery banks 224, offers a number of features and advantages. First, the battery array 200 stores electrical power for the electric loads 220. By way of illustration, the solar-powered aircraft's 100 battery arrays 200 may provide, in aggregate, about 50 to 100 kWh in total energy storage to the solar-powered aircraft 100a, 100b when fully charged. As can be appreciated, however, the amount of energy storage can be increased or decreased by adjusting the number of battery pack assemblies 202 to achieve a desired amount of energy storage. Second, the battery array 200 supplies power through nighttime operation for at least a predetermined period of time (e.g., about 60 to 120 days, or about 90 days). Finally, the battery array 200 tolerates single-fault for flight safety such that the battery array 200 will operate normally in the event of a failure of a battery pack assembly 202, a battery pack 212, or battery cell 772 thereof. For example, the components of the battery array 200 can be provided as line replaceable units (LRU), where a defective battery cell 772 in the battery pack 212 can be switched offline (e.g., switched out/bypassed) to provide further fault protection. Similarly, a defective battery pack 212 in the battery pack assembly 202 can be switched offline to provide further fault protection. Each battery pack assembly 202 may contain, for example, six battery packs 212. The battery packs 212 may be arranged in series, parallel, or a combination thereof to yield a self-reconfigurable multi-cell system (e.g., configured to supply between 130 VDC and 327 VDC). As will be discussion in connection with FIGS. 7a through 7c, the battery cells 772 of the battery pack 212 may be dynamically reconfigured to enable, inter alia, solar peak power tracking and discharge voltage regulation.

Figure 3:
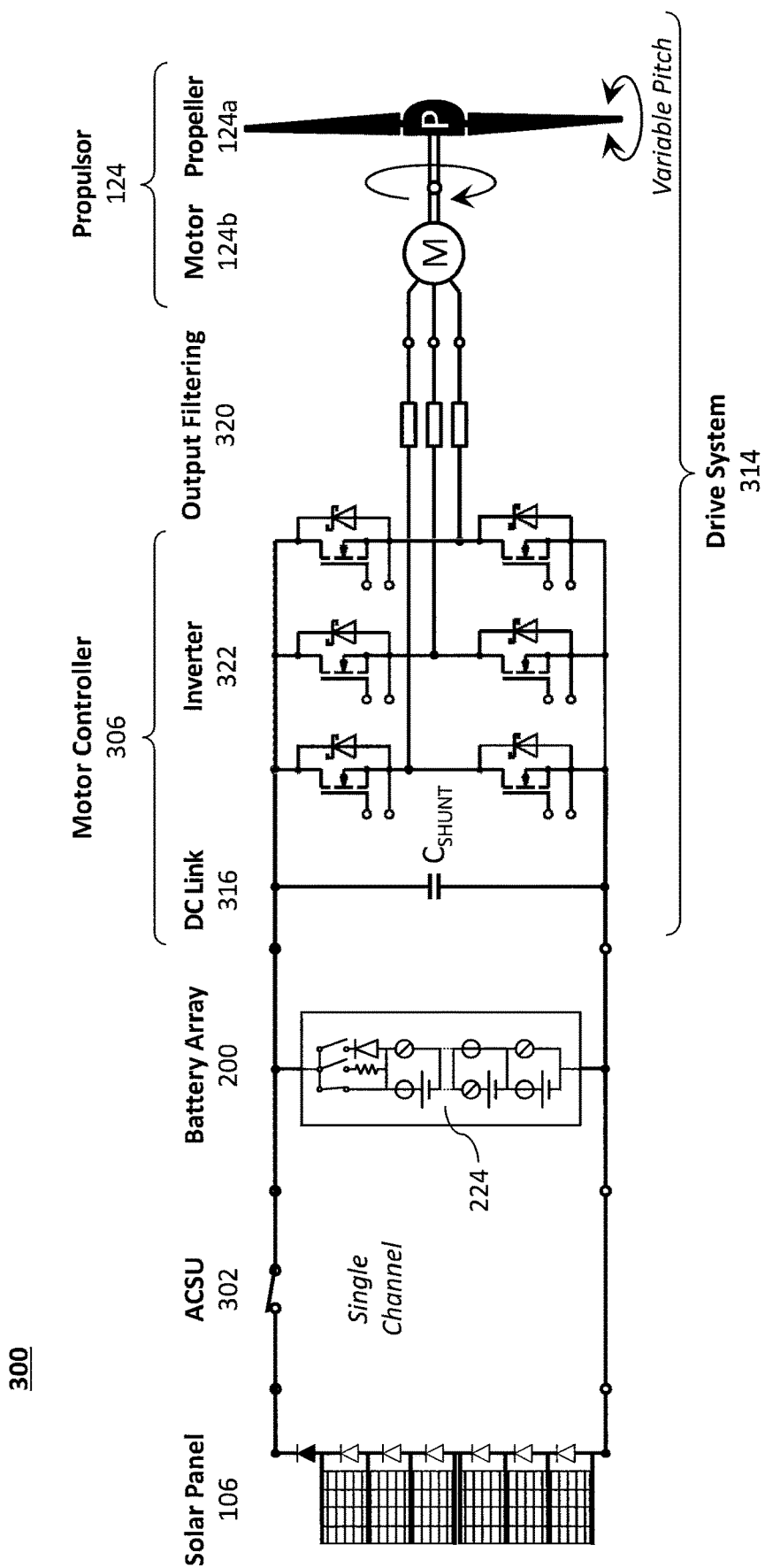
FIG. 3 illustrates an example simplified single power channel for a solar-powered aircraft.

FIG. 3 illustrates a diagram of an example simplified single power channel 300 for the solar-powered aircraft 100a, 100b. As will be appreciated, the solar-powered aircraft 100a, 100b may use multiple simplified single power channels 300 (e.g., one per fuselage 110, one per propulsor 124, etc.). The ACSU 302 may be operably coupled to the battery array 200 (or portion thereof) and the solar panels 106 (or a solar array 226). The ACSU 302 is used to distribute power with and/or between the battery array 200, the solar panels 106, and the electric loads 220 (e.g., the drive system 314, avionics 312, and any payloads). The drive system 314 generally comprises a motor controller 306, one or more propulsors 124 (e.g., a propeller 124a coupled to a motor 124b), and output filtering 320, which filters power delivered by the motor controller 306. The output filtering 320 (e.g., one or more electronic filters) may be positioned between the motor controller 306 and the one or more propulsors 124. The motor 124b may employ, for example, an ironless core Halbach array. A Halbach array employs an arrangement of permanent magnets that augments the magnetic field on one side of the array, while cancelling the field to near zero on the other side. This is achieved by having a spatially rotating pattern of magnetization.

The propeller 124a may employ variable pitch blades where the blades are configured to rotate about their long axis to change the blade pitch relative to the hub. In certain aspects, the propeller 124a may be configured as a reversible propeller where the pitch can be set to a negative value, thereby creating a reverse thrust. A reverse thrust can be used for, inter alia, braking without the need to change the direction of shaft revolution. An optimal pitch for the propeller blade during climb flight conditions can be selected as a function of the motor's 124b design or operating parameter. In certain aspects, the propeller blades may be pitched to maintain an amount of thrust while the RPM is decreased. For example, where the maximum velocity and minimum DC bus voltage define a motor voltage constant (KV), the ceiling climb velocity may be reduced from 1,100 to 1,000 revolutions per minute (RPM) to decrease velocity range and increase optimum DC bus voltage for cruise at altitude.

A motor controller 306 is an electronic circuit configured to vary a motor's speed, its direction, and, when desired, to act as a dynamic brake. The motor controller 306 is illustrated with a DC link 316 and a voltage-source inverter (VSI) converter 322, where the rectifier comprises a diode-bridge and the DC link 316 is a shunt capacitor. The motor controller 306, in effect, provides an electronically-generated three-phase electric power voltage source of energy for the motor 124b. In operation, the motor controller 306 provides an electronically-generated three-phase electric power voltage source of energy for the motor 124b. The pulse width modulation (PWM) frequency of the motor controller 306 may be optimized for combined motor 124b and motor controller 306 efficiency. For example, the PWM frequency may be optimized to lower control risk due to high rate of current change (dI/dt), which can be particularly useful in situations with large voltage overhead. Further, optimizing the PWM frequency can address bus capacitance for short and long lines and bus outage.

Figure 4:
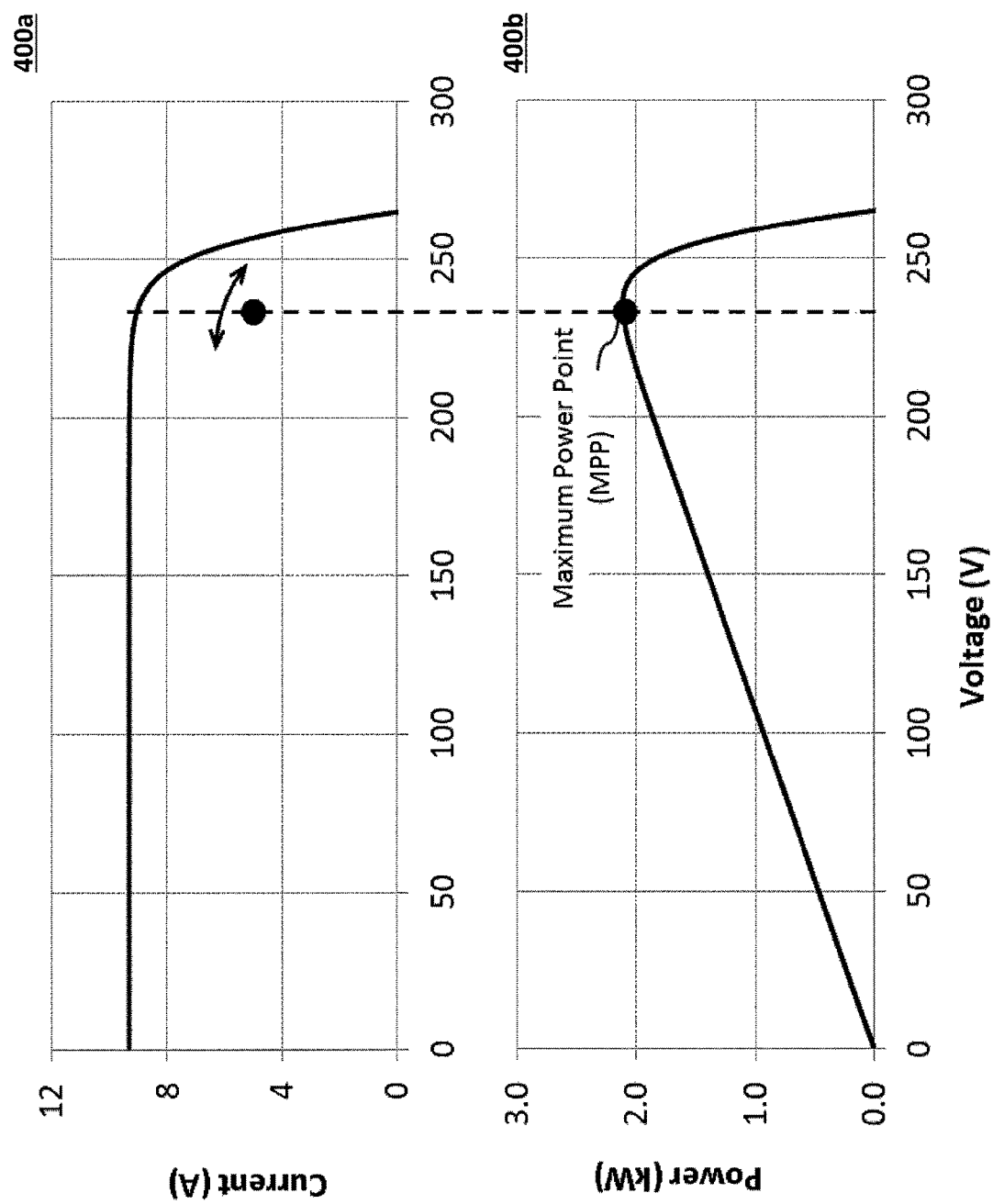
FIG. 4 illustrates a set of charts illustrating a maximum power point.

The voltage at which a solar panel 106 or a solar array 226 can produce maximum power is called the maximum power point (MPP, or, sometimes, peak power voltage). With reference to the current (A) and power (kW) graphs 400a, 400b of FIG. 4, MPP tracking (MPPT) is used to extract a maximum available power from the solar panel 106 at the current conditions. MPPT is important in solar powered systems. Generally, MPPT varies solar panel load loading to optimize solar output power. The electrical connection between solar panel(s) 106 and battery array 200 (or portion thereof), in conjunction with dynamic reconfiguration of the battery array 200, enables MPPT of the solar panel(s) 106 (e.g., at 2 Hz). For example, a perturb-and-observe algorithm may be applied as the MPPT control scheme. Perturb-and-observe techniques can be implemented by adding (or removing) a battery cell 772 to (or from) the battery pack 212. Therefore, in operation, battery cells 772, for example, can be added or removed from the battery string in battery pack 212 to facilitate MPPT. Generally, optimum voltage can be achieved within ½ cell voltage on average with only approximately ~0.7% error.

During daylight hours, each solar panel 106 may be connected to a battery bank 224, whereby solar energy collected by the solar panels 106 is used to charge the battery bank(s) 224. Solar panels 106 that are generating the highest power (e.g., the most power) may further be used to supply power to the drive system 314, thereby maximizing usage of the generated power. As can be appreciated from the diagram, there is no power conversion loss between the solar panels 106 and battery bank 224/electric loads 220, aside from Joule loss attributable to, for example, wiring resistance and heating.

Figure 5:
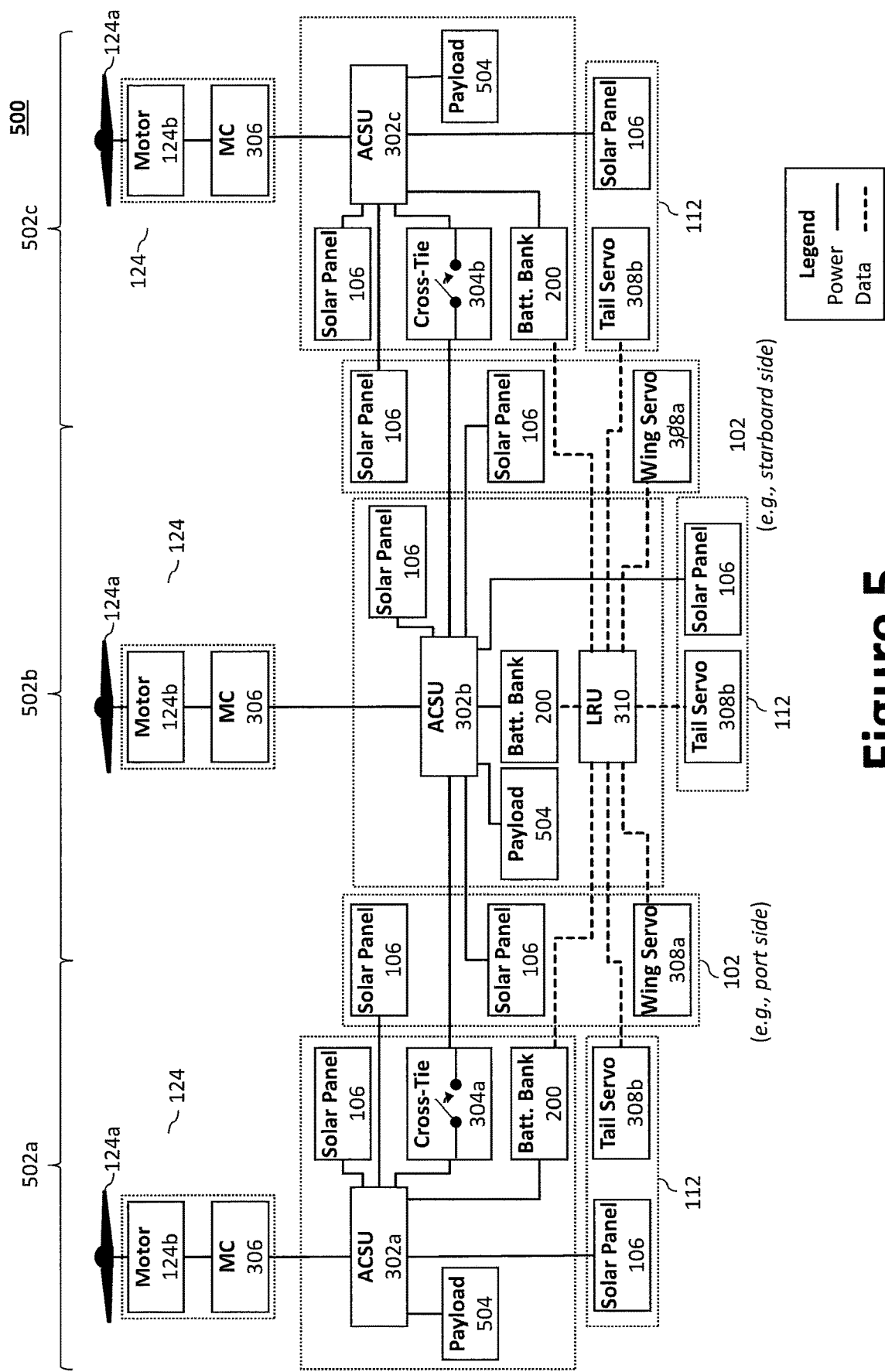
FIG. 5 illustrates an example electrical power system for the solar-powered aircraft.

FIG. 5 illustrates a block diagram of an example electrical power system 500 for the solar-powered aircraft 100a, 100b. In operation, the electrical power system 500 provides power to the solar-powered aircraft 100a, 100b via a combination of battery arrays 200 and solar panels 106 (e.g., solar arrays 226). While the following discussion and figures will use the term solar panel 106, it should be understood that the disclosure is not necessarily limited to a single solar panel 106, but could be a single solar panel 106 or multiple solar panels 106 arranged in a solar array 226.

Power from the solar panel 106 and/or battery array 200 can be used to power, inter alia, avionics 312 (e.g., actuators, control systems, etc.), one or more payloads 504, etc. For example, the power from the solar panel 106 and/or battery array 200 may be used to power, in response to commands from a flight controller or the vehicle management system 218, one or more wing servos 308a (e.g., actuators to control the flight control surfaces on the wing 102, if used, such as aileron) and tail servos 308b (e.g., actuators to control the flight control surfaces on the tail sections 112, such as rudders 114 and elevators 116). The battery arrays 200 and various servos (e.g., the wing servos 308a and the tail servos 308b) may be monitored by a line replaceable unit (LRU) 310.

Each battery array 200 may include one or more battery pack assemblies 202, which may be arranged into one or more battery banks 224, each battery bank 224 being composed of two or more battery pack assemblies 202. The battery banks 224, for example, may be positioned on the fuselage 110, tail sections 112, the wing 102 (e.g., the leading edge or the upper surface), etc. Each propulsor 124 is illustrated as having a motor 124b and a dedicated motor controller 306. Additional solar panels 106 may be positioned on each of the tail sections 112 (e.g., the horizontal stabilizer 126 and the vertical stabilizer 108). In certain aspects, the wing 102 may support multiple solar panels 106 that are arranged into different, separate solar arrays 226. For example, a first solar panel 106 may be positioned at the leading edge, while a second solar panel 106 may be positioned on an upper (top) surface of the wing 102, between the leading edge and the trailing edges (e.g., forward of flight control surfaces, if used).

An advantage of the electrical power system's 500 architecture is that the power buses are nominally isolated from one another. For example, the electrical power system 500 may be generally divided into sub-systems 502a, 502b, 502c (e.g., electrically-isolated domains) such that electrical failure in one sub-system does not propagate to another sub-system. For example, the electrical power system 500 may be generally divided into two or more electrically isolated sub-systems (illustrated as three sub-systems 502a, 502b, 502c in FIG. 5), each sub-system may correspond to a different region of the solar-powered aircraft 100a, 100b (e.g., a fuselage 110, wing 102, portion of a wing 102, etc.). Accordingly, damage to components of the electrical power system 500 situated at one region of the solar-power aircraft 100a, 100b (e.g., a wing 102) should not propagate to components of the electrical power system 500 situated at other regions of the solar-power aircraft 100a, 100b (e.g., the fuselages 110, tail sections 112, etc.). As illustrated, each sub-system 502a, 502b, 502c of the solar-powered aircraft 100a, 100b may include a solar panel 106 to collect energy, a battery bank 224 to store energy collected by the solar panel 106, and a dedicated ACSU 302a, 302b, 302c.

While sub-systems 502a, 502b, 502c are self-sufficient to limit failure propagation, to further mitigate failures, cross-tie switches 304a, 304b can be positioned between sub-systems 502a, 502b, 502c to transfer power across the solar-powered aircraft 100a, 100b. Therefore, the ACSUs 302a, 302c of the first and third sub-systems 502a, 502c may couple to the ACSU 302b of the second sub-system 502b via a set of cross-tie switches 304a, 304b. In operation, the cross-tie switches 304a, 304b may be selectively actuated to couple, electrically and communicatively, the desired sub-systems 502a, 502b, 502c. For example, in the event of failure of the ACSU 302c of the third sub-system 502c, the cross-tie switch 304b may be actuated to allow the ACSU 302b of the second sub-system 502b to control the power components of the third sub-system 502c in lieu of the ACSU 302c. The cross-tie switches 304a, 304b may employ mechanical switches (e.g., solenoid-driven relays), solid-state switches (e.g., transistors, such as insulated-gate bipolar transistors (IGBT), field effects transistors (FETs), metal-oxide-semiconductor field-effect transistors (MOSFET), etc.), or a combination thereof. Each of the cross-tie switches 304a, 304b may be controlled by, for example, one or more of the ACSUs 302.

Figure 6:
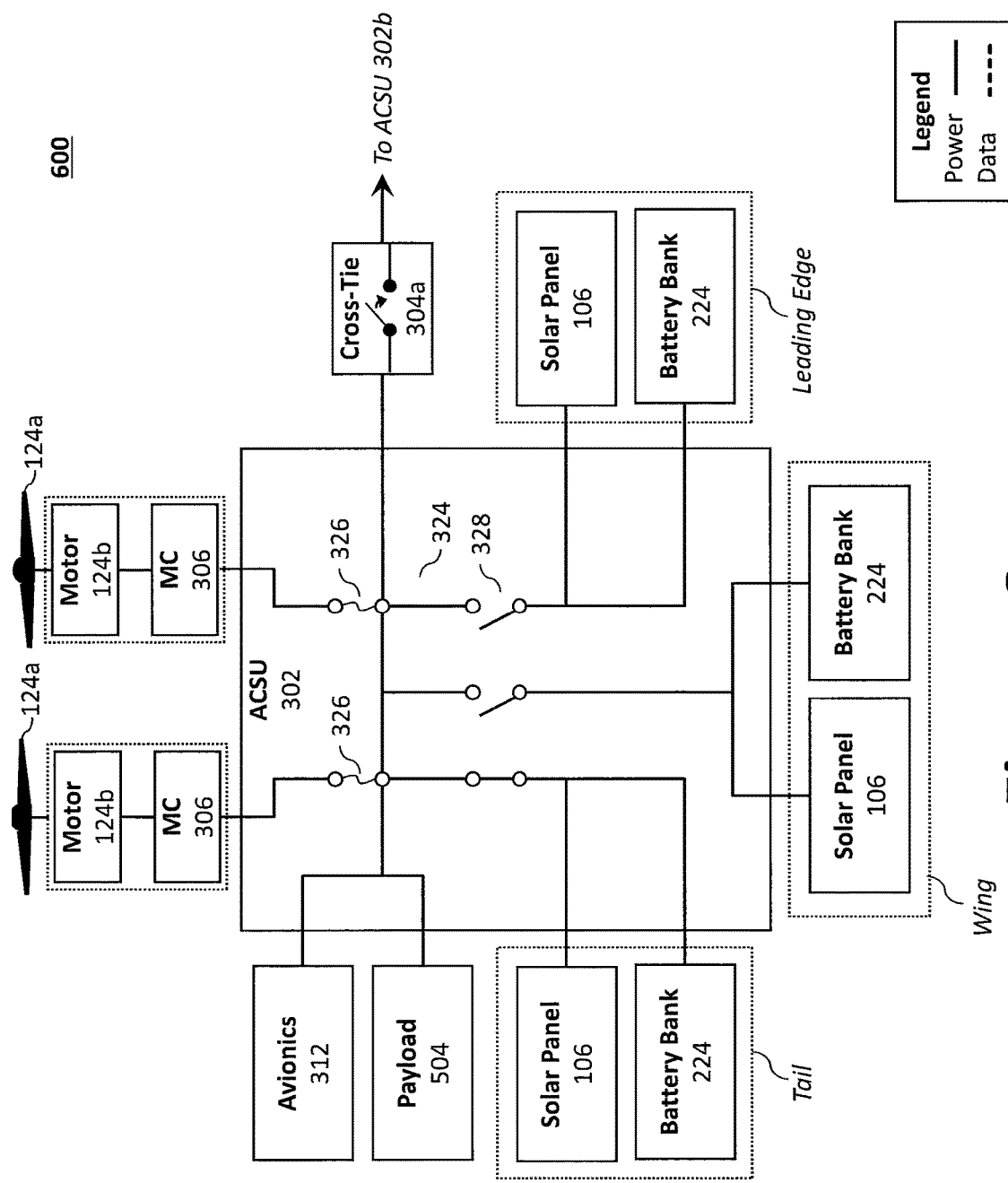
FIG. 6 illustrates an example power diagram for an array consolidation and switching unit (ACSU).

FIG. 6 illustrates a power diagram 600 for an example ACSU 302. The ACSU 302, which is illustrated in the daytime configuration, provides flexibility in powering the motors 124b coupled to a local motor bus 324 from one or more sources. As illustrated, the ACSU 302 is coupled to one or more solar panels 106 and battery banks 224, which may be positioned on the wing 102, tail section 112, etc. As illustrated, the battery banks 224 can be coupled to the local motor bus 324 through one or more of the ACSU 302 within the electrical power system 500. The number of battery pack assemblies 202 or battery banks 224 in each battery array 200 may vary depending on the physical constraints of the installation location in the solar-powered aircraft 100a, 100b. For example, five battery pack assemblies 202 may be arranged in a battery bank 224 in each wing 102, while two battery packs assemblies 202 may be may be arranged in a battery bank 224 of the leading edge of each wing 102 and/or the tail section 112. The battery banks 224 may be coupled to the local motor bus 324 using one or more switches 328 as a function of, inter alia, the charge state of the battery array 200 and/or maximum power points (MPP) voltage of the solar panel 106. The one or more switches 328 may be mechanical switches, solid-state switches, or a combination thereof. One or more electrical safety devices 326 (e.g., fuses, e-Fuses, circuit breakers, resettable fuses, such as a polymeric positive temperature coefficient (PPTC) devices, etc.) may be provided in-line between the local motor bus 324 and the motor controller 306 to provide over-current protection. While the solar panels 106 of FIG. 6 are illustrated as tied directly to a battery bank 224, the avionics 312 and/or payload 504 may instead be configured to pull power from all battery banks 224 of the electrical power system 500, which may be arranged in an "OR" configuration using, for example, ideal diodes.

Solar panels 106 can display different MPP voltages depending on the age and operating conditions of the solar-powered aircraft 100a, 100b. Operating conditions include, for example, shadowing, incident angle, etc. Therefore, the solar-powered aircraft's 100 solar panels 106 are distributed as solar arrays 226 on areas of the airframe that have similar solar incidence angles (displaying similar power point behavior). By separating the electrical power system 500 into multiple sub-systems 502a, 502b, 502c, each representing an array zone (e.g., an array zone for each of the fuselage, wing, leading edge, tail, etc.) and separately controlling the battery voltage in each zone, the MPP for each solar array 226 is achieved. The solar-powered aircraft 100a, 100b may have, for example, nine separate solar arrays 226, each corresponding to a different array zones. The array zones can include, for each wing 102 (or portion thereof), a leading edge array, a wing (upper surface) array, and a tail array.

Due to their surface area, the wing(s) 102 is/are typically the largest overall contributor to energy collection. The solar panels 106 may employ thin-film copper indium gallium selenide (CIGS) for the bulk of the solar arrays, which offer efficiencies of about 12 to 17%. Thin-film CIGS arrays can be fabricated on a flexible substrate, which is useful for covering curved surfaces (e.g., aircraft wings). The flexible substrate may be, for example, a polyamide substrate. In another aspect, where desired, the solar panels 106 may employ thin-film gallium arsenide (GaAs) to target high-value locations on the solar-powered aircraft 100a, 100b, which offer efficiencies in excess of 25%. During testing, GaAs arrays have demonstrated un-encapsulated efficiencies of about 28% with a mass of 237 g/m$^2$, which is about 2.6 times the mass of the CIGS arrays.

Traditional, rechargeable battery packs contain a hard-wired string of batteries (a fixed battery string). A fixed battery string architecture can minimize the footprint (e.g., size, weight, power requirements, etc.) of the battery management system, but the output voltage has an increasing variance during a cycle from fully charged to fully discharged as the battery cell count increases and/or the battery cells cycle from fully charged to fully discharged. Therefore, as a result of the large output swing, additional hardware is typically implemented to regulate the output voltage of the battery system at a penalty of reduced overall efficiency lost to the output conversion process. A battery management system that can intelligently reconfigure the number of batteries (e.g., battery cells) in a battery string can obviate the need for an additional voltage regulator stage. Therefore, the battery array 200 may allow for dynamic reconfiguration at various levels of control granularity (e.g., per battery bank 224, per battery pack assembly 202, per battery pack 212, and/or per battery cell 772).

Battery pack assemblies 202 in each sub-system 502a, 502b, 502c or region of the solar-powered aircraft 100a, 100b may be partitioned into battery banks 224. Each battery bank 224, as noted above, is typically composed of two or more battery pack assemblies 202. The quantity of battery pack assemblies 202 per battery bank 224 and the number of battery banks 224 per sub-system 502a, 502b, 502c may be sized based on the size of the local solar panel 106 (or solar array 226) and contribution to overall energy collection. In one example, five battery pack assemblies 202 may be arranged to define the battery bank 224. Each battery bank 224 may be matched to a solar panel 106 or solar array 226. For example, (1) the solar panel 106 in the wing 102 may be paired with the battery bank 224 in the wing 102, (2) the solar panel 106 in the leading edge of the wing 102 may be paired with the battery bank 224 in the leading edge of the wing 102, and (3) the solar panel 106 in the tail section 112 may be paired with the battery bank 224 in the tail section 112. The matching may be designed to minimize the effect upon the electrical power system 500 in the event of localized damaged to the solar-powered aircraft 100a, 100b.

The solar-powered aircraft 100a, 100b can include a battery management system 700 to regulate the output voltage of a multi series-connected reconfigurable battery system (e.g., battery pack assembly 202), by dynamically selecting a subset of all available battery cells 772 and dynamically switching them in to (online) or out of (offline) the battery string 766 (aka, cell string or cell string array).

The battery management architecture provides an intelligent processing system that monitors and controls the reconfigurable battery functions. To that end, the battery management architecture includes a battery pack controller 730 operatively coupled to a battery supervisory circuit 732 to enable (online) or bypass (offline) any battery cell 772 in the battery string to adjust the variable output voltage of the reconfigurable battery pack 212 to achieve a commanded output voltage for the battery string. While illustrated using separate blocks and components, the battery pack controller 730 and the battery supervisory circuit 732 may share common circuitry and/or common processors. For example, the battery pack controller 730 and the battery supervisory circuit 732 may be provided as a single system or component.

As will be discussed, the battery management system 700 can use a combination of hardware switching and protection elements, and a software-based cell-selection process based on a number of cell- and pack-level criteria. The hardware instrumentation measures one or more parameters, including battery voltage, battery temperature, battery-string voltage, battery-pack voltage, battery-pack current, battery-pack-assembly voltage, battery-pack-assembly current, battery pressure (e.g., cell-stack pressure), and/or other parameters useful to inform the cell-selection process within the battery management system 700. This information is evaluated by a processor and associated software via the battery pack controller 730 to determine the state of charge (SoC), state of health (SoH), and equivalent resistance of each battery cell 772 in the battery pack 212, which may be updated on a periodic basis.

As noted above, battery management systems that cannot switch battery cells 772 in or out of a battery string 766 are limited by the weakest battery cell 772 in the battery string 766. Such limitations include, for example, battery pack capacity, charge rate (enter balance charge early), and maximum discharge rate (high internal resistance). Using a battery pack controller 730 to implement a reconfigurable architecture via one or more battery switches 762 (e.g., a bi-directional switch) allows for the creation of any combination of battery cells 772 in a battery string 766—up to the maximum number of battery cells 772 in the battery pack 212 of the battery pack assembly 202. Additionally, the reconfigurable architecture provides the ability to regulate the output voltage of the battery pack assembly 202 to within 50% of a battery voltage. An obstacle, however, is that there will need to be excess battery cells 772 in the battery pack assembly 202 to recover from failures or regulate output voltages.

Figure 7A:
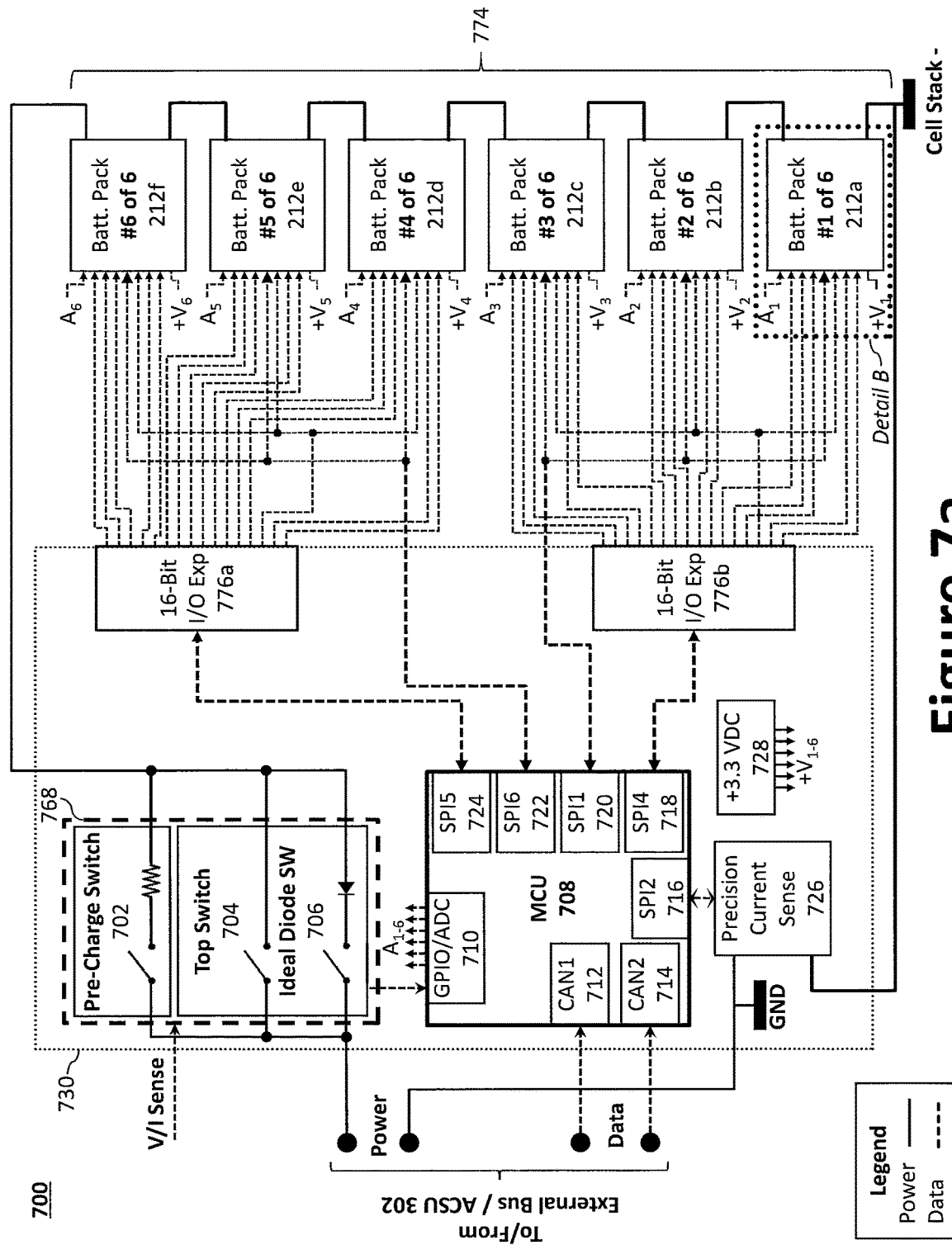
FIG. 7a illustrates a block diagram of a battery management system.

FIG. 7a illustrates a block diagram of an example battery management system 700 having battery pack assembly 202 in a reconfigurable architecture. The battery management system 700 provides a number of advantages. First, the battery management system 700 provides a modular architecture that can be modular down to the level of an individual battery cell 772. Second, it provides a complete solution to reconfigurable battery protection and management. Third, it allows for the addition and removal of battery cells 772 from a series of a battery string 766, which can be performed to adjust an output voltage to yield a variable output voltage or to bypass a defective battery cell 772. Fourth, it enables isolated power domains (e.g., switchable battery modules 770, battery packs 212, battery pack controller 730, etc.) to enable scalable configurations. Fifth, it offers output regulation without requiring complex voltage conversion circuitry. Finally, it can detect and remove battery cells 772 as they wear out or fail without diminishing overall performance of battery pack 212 or battery pack assembly 202.

The battery pack assembly 202 generally comprises a battery pack controller 730 and a plurality of battery packs 212 (illustrated in FIG. 7a as six battery packs 212a, 212b, 212c, 212d, 212e, and 212f) connected to one another to define a battery pack string 774, which can serve as a battery pack assembly 202. In operation, the battery pack controller 730 monitors and controls operation of the battery pack string 774, including each of the battery packs 212 and components thereof. The battery pack controller 730 may generate a plurality of system outputs (e.g., instructions, which may be analog or digital) to control operation of the battery pack assembly 202 and/or battery packs 212. For example, the battery pack controller 730 can be configured to generate cell-select commands to insert/bypass individual battery cells within the battery packs 212. The system outputs may be based on two or more system inputs. Example system inputs include, inter alia, individual voltage measurements (e.g., per battery cell 772), individual temperature measurements (e.g., per battery cell 772, which may be measured via temperature sensor 758), current measurements (e.g., through battery string 766), and output voltage measurements of the battery pack assembly 202 (e.g., the measure value of the variable output voltage), which may be measured on each side of the top switch 704. Example system outputs may include, inter alia, battery switch control instructions (e.g., a signal/command), the power to the connected load (e.g., a per battery pack 212 or per battery pack assembly 202 basis), and total voltage (e.g., on a per battery pack 212 or per battery pack assembly 202 basis). In other words, the battery pack controller 730 selectively inserts/bypasses battery cells 772 so that they can be charged, discharged, or bypassed. For example, the battery cells 772 may be selectively bypassed to achieve a desired voltage or to charge/discharge only a select number of battery cells 772 (e.g., depending on the operating mode or conditions).

The battery pack controller 730 also provides over-voltage and under-voltage protection, as well as over-current protection and short-circuit protection. The battery pack assembly 202 may comprise, for example, six battery packs 212 (illustrated as 212a through 212f) electrically connected as a string in series; however, the quantity of battery packs 212 in the battery pack assembly 202 may be sized based on the energy storage needs of the application. It is also possible to electrically connect the battery packs 212 in other electrical configurations to achieve a desired voltage and/or capacity (e.g., in parallel, or a combination of series and parallel).

As illustrated, the battery pack controller 730 may comprise a plurality of bus output switches 768, a microcontroller unit (MCU) 708 operatively coupled with a memory device (e.g., RAM, ROM, flash memory, etc.), a precision current sensor 726 to measure the current to/from the string of battery packs 212, a set of input/output (I/O) expander integrated circuits (IC) 776a, 776b, and a DC power supply 728 (e.g., +3.3 VDC supply) to supply any power needed to operate the various components of the battery pack controller 730, such as the processors (e.g., MCU 708) and other ICs. Depending on the desired number of connections, the I/O expander ICs 776a, 776b may be, for example, a 16-bit expander.

The plurality of bus output switches 768 can be used to couple the battery pack string 774 to the ACSU 302 so that the battery pack string 774 (or portion thereof) can be charged or discharged. The plurality of bus output switches 768 may comprise, for example, a pre-charge switch 702, a top switch 704 (e.g., a main switch), and an ideal diode switch 706. Each of the bus output switches 768 may be arranged electrically in parallel. Voltage and current sensing of the battery bank 224 of the battery pack assembly 202 may be determined at the bus output switches 768. The plurality of bus output switches may be mechanical switches, solid-state switches, or a combination thereof.

The pre-charge switch 702 may be a bi-directional, maximum string voltage blocking, high impedance output contactor. The pre-charge switch 702 electrically connects the plurality of battery packs 212 to the ACSU 302. As illustrated, the pre-charge switch 702 is provided in line with one or more resistors to provide surge suppression and to limit charge current at the end of charge. The pre-charge switch 702 may employ a bidirectional blocking switch element rated to the maximum output of the battery pack assembly 202. Bi-directionality allows the switch to control current flowing into or out of the battery pack assembly 202. The pre-charge switch 702 may have a higher resistance relative to the top switch 704 (e.g., about 10 ohm (Ω) to 30Ω, or about 20Ω). In operation (i.e., when closed), the pre-charge switch 702 limits in-rush or out-rush currents during safe-to-mate bus connections.

The top switch 704 may be a bi-directional, maximum string voltage blocking, low impedance output contactor. The top switch 704 connects the plurality of battery packs 212 directly to the ACSU 302. The top switch 704 may be designed with ultra-low resistance to minimize losses during nominal operation, resulting in a low insertion loss. The top switch 704 may employ a bidirectional blocking switch element rated to the maximum output of the battery pack assembly 202. Bi-directionality allows the top switch 704 to control current flowing into or out of the battery pack assembly 202. The top switch 704 enables the battery packs 212 (e.g., those of the switchable battery modules 770) to use switches with lower blocking voltages.

The ideal diode switch 706 may be a unidirectional, maximum string voltage blocking, low impedance discharge only contactor. The ideal diode switch 706, when enabled, prevents current flow into the plurality of battery packs 212 through top switch 704 via the diode. The ideal diode switch 706 allows only for discharging of the battery pack assembly 202. The ideal diode switch 706 may be typically used when multiple battery pack assemblies 202 are connected in parallel (e.g., to define the battery bank 224).

The MCU 708 controls overall operation of the battery pack assembly 202 in response to commands from, for example, the system controller 216. For example, the MCU 708 may perform battery management and control algorithms to ensure that the battery cells 772 in the system are operating with in safe operating conditions. To that end, the MCU 708 may monitor, inter alia, SoC, SoH, and battery resistance, which can be used to perform sorting and battery balancing. The MCU 708 may be operably coupled with the ACSU 302 over, for example, a controller area network (CAN). The MCU 708 comprises a general purpose (digital) input/output (GPIO) signals, analog-to-digital converter (ADC) 710, a set of CAN interfaces 712, 714 and a plurality of serial peripheral interface (SPI) buses 716, 718, 720, 722, 724. The MCU 708 is communicatively coupled with each of the battery packs 212 via one or more SPI data busses. I/O expander ICs 776a, 776b allow for multiple control signals that expand the available I/O to the MCU 708.

Figure 7B:
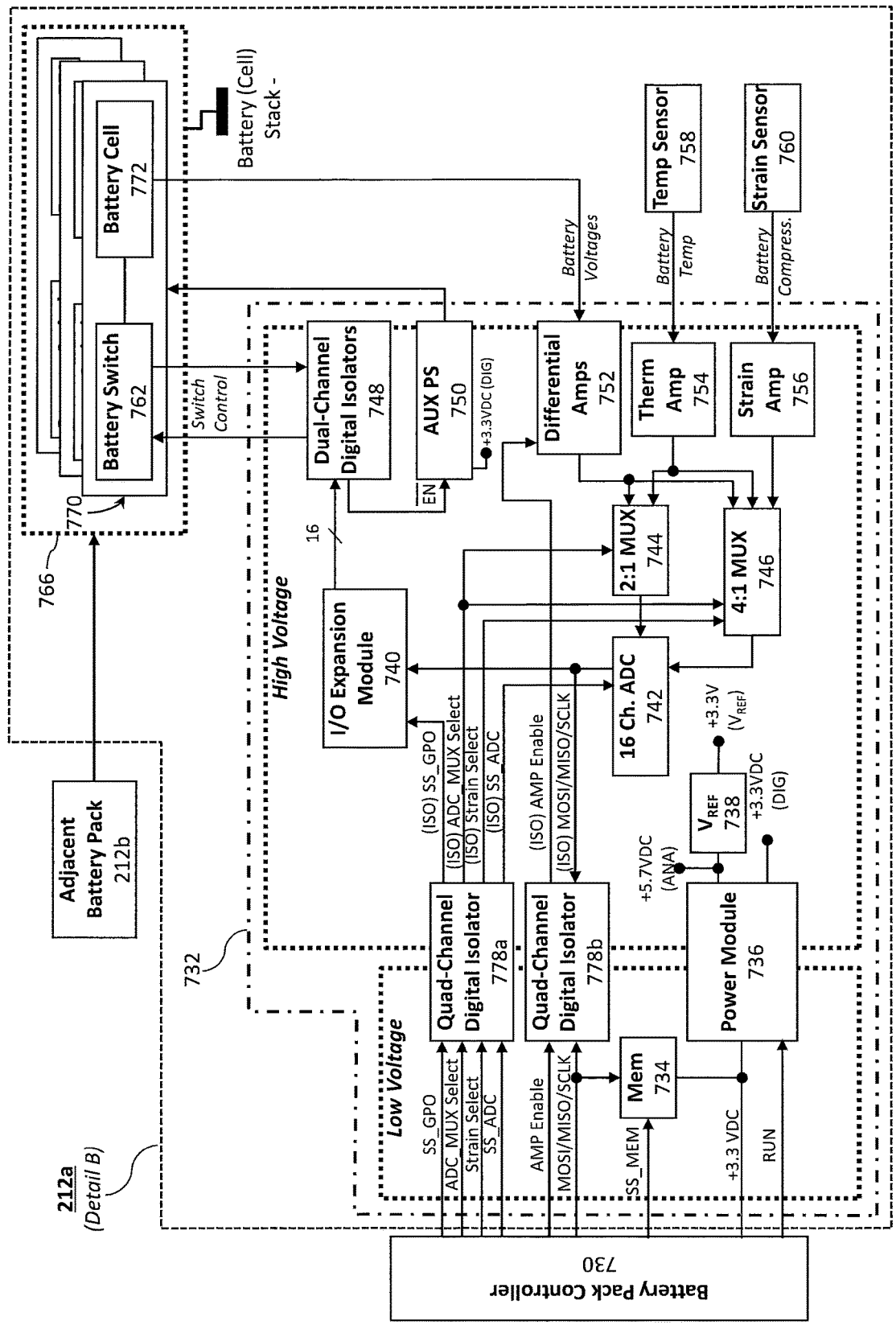
FIG. 7b illustrates a block diagram of an example battery pack of a battery management system.

FIG. 7b illustrates a block diagram of an example battery pack 212 (e.g., Detail B of FIG. 7a, battery pack 212a) having a battery supervisory circuit 732. Together with the battery pack controller 730, the battery supervisory circuit 732 converts cell-select commands from the battery pack controller 730 to selectively insert/bypass individual battery cells 772 of the battery string 766 within the battery pack 212, while also conditioning and digitizing voltages and temperatures of the individual battery cells. A strain measurement may be included from each battery pack 212 to monitor the compression of the battery cells 772 of each battery pack 212. The battery pack 212 generally comprises a plurality of battery cells 772, and a plurality of battery switches 762 to selectively enable (activated) or bypass one or more of the plurality of battery cells 772 within the battery string 766. The plurality of battery switches 762 may be electrically coupled to the plurality of battery cells 772 via a printed circuit board assembly (PCBA). The battery cells 772 may be provided as single-cell batteries, multi-cell batteries, or a combination thereof. Depending on the desired nominal voltage of a multi-cell battery, for example, the battery cells may be electrically arranged and connected in a series configuration, in a parallel configuration, or a combination thereof to achieve a desired nominal voltage and/or power for the battery cell 772.

In addition to serving as a battery cell interface, the PCBA can serve as a platform for the battery supervisory circuit 732 (or a portion thereof). The battery supervisory circuit 732 generally comprises low voltage circuitry, high voltage circuitry, a plurality of temperature sensors 758, and a plurality of strain sensors 760. The battery pack 212 may comprise a dedicated memory 734 for storing battery cell 772 and PCBA-specific parameters.

A pair of quad-channel digital isolators 778a, 778b may be communicatively coupled with the I/O expander ICs 776a, 776b of the battery pack controller 730. The pair of quad-channel digital isolators 778a, 778b may be used to communicate digital signals from the battery pack controller 730, across a magnetic, optical, or galvanic isolation boundary between the low and high voltage circuitry, to the high voltage side of the circuitry.

An I/O expansion module 740 may be used to communicate data directionally between the battery pack controller 730 (via the quad-channel digital isolator 778a) and the battery string 766. As illustrated, the battery string 766 generally comprises a plurality of switchable battery modules 770, each switchable battery module 770 having a battery cell 772 and a battery switch 762 associated therewith. As will be described in greater detail below, the switchable battery modules 770 may be electrically arranged in series to define the battery string 766 composed of battery cells 772 that are configured in an active state (e.g., via the battery switches 762).

The I/O expansion module 740 may communicate, for example, switch control signals between the battery pack controller 730 and the battery switches 762 of the switchable battery modules 770 to selectively activate/deactivate the battery cells 772, for example. The I/O expansion module 740 may be, for example a 16-bit I/O expansion module (e.g., one for each of the 16 battery cells 772). A dual channel isolator 748 may be positioned between the I/O expansion module 740 and each of the battery switches 762. In the event of voltage loss at one or more any battery cells 772 voltage (resulting from, for example, a broken battery cell tab/contactor), an auxiliary (AUX) power supply (PS) 750 can be included at each battery pack 212 to ensure the local switching circuit remains powered through the voltage loss event. The auxiliary power supply has an isolated output, so it can be used at every cell location. The auxiliary power supply may also be enabled by the loss of the associated cell voltage.

An isolated power module 736 can be provided to supply power needed to operate the various components (e.g., ICs, such as the memory 734) of the low and high voltages circuits. The isolated power module 736 may be coupled to a reference voltage 738 (e.g., +3.3V), +3.3 VDC (DIG), +5.7 VDC (ANA). The isolated power module 736 may be, for example, an isolated flyback μModule DC/DC converter with low-dropout (LDO) post regulator with an isolation rating of, for example, 725 VDC. The isolated power module 736 may be operable over an input voltage range of 3.1V to 32V with an output voltage range of 2.5V to 13V (set by a single resistor). The isolated power module 736 may also include a linear post regulator whose output voltage is adjustable from 1.2V to 12V as set by a single resistor. A suitable isolated power module 736 includes, for example, the LTM8048, which is available from Linear Technology.

Various parameters of the battery cells 772 may be measured and communicated to the battery pack controller 730 (via the battery supervisory circuit 732) for processing. The parameters may be monitored/measured on a per battery cell 772 basis. Example parameters include, for example, voltage, current, temperature, and compression of the battery cell 772. For example, the plurality of temperature sensors 758 and the plurality of strain sensors 760 can be physically positioned adjacent the battery cell 772 in the battery pack 212 to monitor, respectively, the temperature and strain of each of the battery cells 772. For example, each battery cell 772 may be associated with a temperature sensor 758 and/or a strain sensor 760 to allow the battery supervisory circuit 732 to monitor each of the battery cells 772 individually. In certain aspects, the battery cell 772 may be configured as a 2p cell assembly where a temperature sensor 758 and/or a strain sensor 760 may be positioned between the two p cells. Alternatively, a single strain sensor 760 could be used to monitor the compression of the full battery pack 212.

Measurements from each of the plurality of temperature sensors 758 (e.g., cell temperature) can be communicated to a thermistor conditioning amplifier 754 on the high voltage side, while measurements from the strain sensor(s) 760 (e.g., cell compression) can be communicated to a strain signal amplifier 756 on the high voltage side. The voltage measurements for each battery cell 772 may be provided using a differential amplifier 752, which can function as a voltage sensor, on the high voltage side. In certain aspects, a thermistor conditioning amplifier 754 may be provided for each temperature sensor 758 and a differential amplifier 752 may be provided for each battery cell 772. Therefore, in a battery pack 212 having 16 battery cells 772, 16 thermistor conditioning amplifiers 754 and 16 differential amplifiers 752 may be used. While it is possible to provide a temperature sensor 758 and/or a strain sensor 760 at each battery cell 772, a single temperature sensor 758 and/or a single strain sensor 760 may instead be used for the entire battery cell-stack of a battery pack 212.

The measured parameters from the thermistor conditioning amplifiers 754, the strain signal amplifier(s) 756, and the differential amplifiers 752 may be inputted to one or more multiplexers. In operation, the one or more multiplexers select one of plurality of analog (or digital, if applicable) input signals from the various sensors and forwards the selected input into a single output. The one or more multiplexers may include, for example, a 2:1 multiplexer 744 and a 4:1 multiplexer 746. The output from the 2:1 multiplexer 744 and the 4:1 multiplexer 746 may be inputted to an analog-to-digital (A-D) voltage converter 742. The A-D voltage converter 742 may be, for example, a 16-channel (8-differential) micropower 16-bit ΔΣ analog-to-digital converter. The parameters, now in digital format, may be outputted from the A-D voltage converter 742 and back to the battery pack controller 730 via the quad-channel digital isolator(s) 778a, 778b and SPI bus for processing. As can be appreciated, one or more clock (clk) signals may be used to synchronize the components during data/signal processing.

Figure 7C:
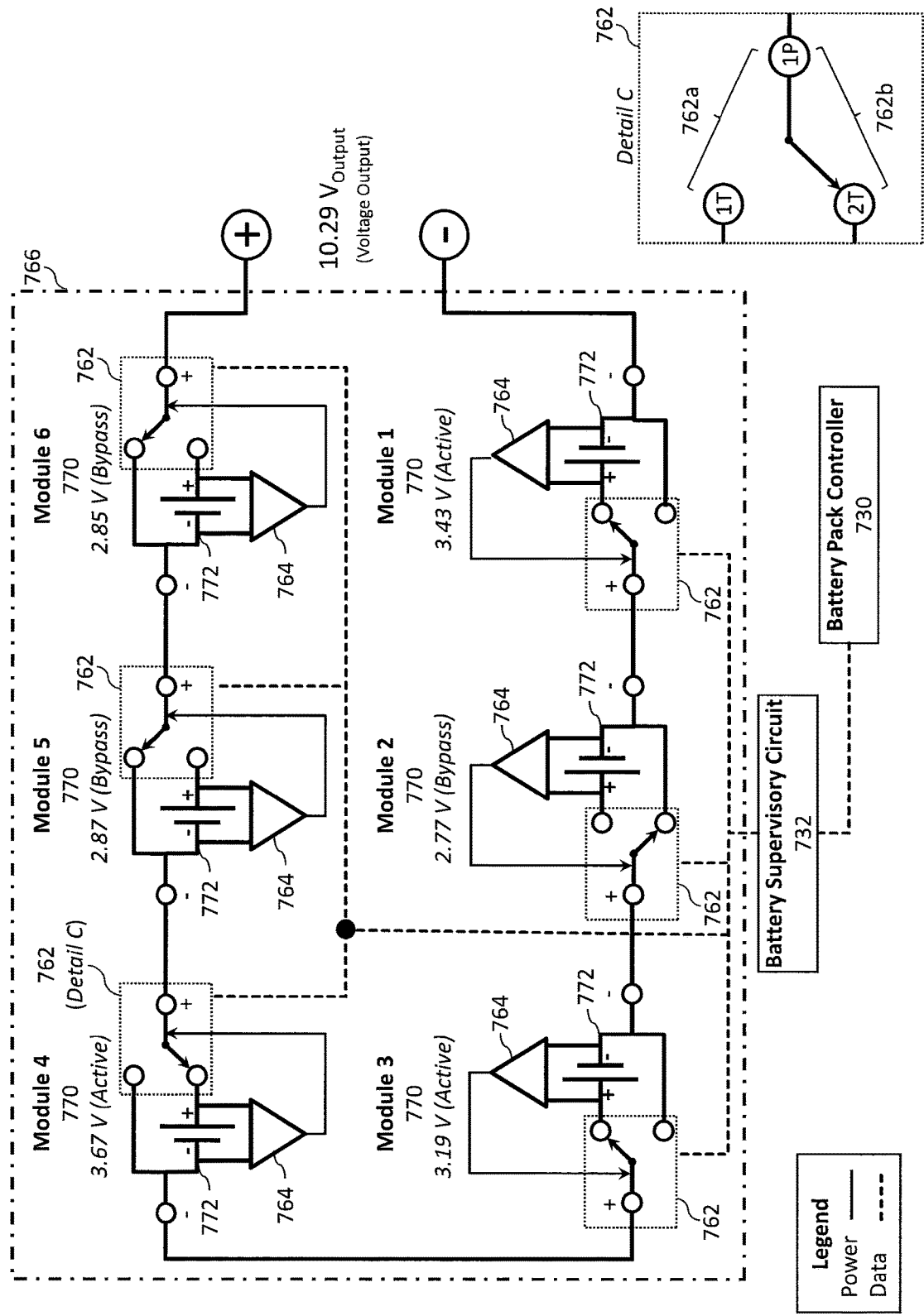
FIG. 7c illustrates a diagram of an example battery string of a battery pack.

FIG. 7c illustrates a diagram of an example battery string 766 for use in a battery pack 212. As illustrated, the battery string 766 may comprise a plurality of switchable battery modules 770 arranged in series. Each switchable battery module 770 comprises, for example, a battery cell 772 (e.g., a single battery cell or multiple battery cells, which can be arranged as a cell assembly), a battery switch 762, and a cell selection algorithm function 764. For illustrative purposes, the battery string 766 is illustrated with six switchable battery modules 770; however, additional or fewer switchable battery modules 770 may be used. In operation, one or more desired battery cells 772 can be selected and switched into the battery string 766 via the battery switches 762 such that aggregate string voltage of the battery pack 212 (output voltage) achieves a predetermined target output voltage.

The number of cells per battery cell 772 in a switchable battery module 770 may be adjusted based on the desired level of control granularity of the battery pack 212. In one example (e.g., where a more-granular switching approach is desired), the switchable battery module 770 may comprise a single-cell battery with a single battery cell such that a single battery cell may be added to, or removed from, the battery string 766 one-by-one (i.e., individually). In other words, each battery switch 762 (and associated cell selection algorithm function 764) may be associated with a single battery cell and configured to electrically connect (insert or activate) or electrically disconnect (remove or bypass) the single battery cell from the active battery string 766.

In another example (e.g., where a less-granular switching approach is desired or acceptable), the switchable battery module 770 may comprise a multi-cell battery having multiple battery cells (e.g., two or more, which may be connected electrically to one another in series or in parallel) may be added to, or removed from, the battery string 766 individually. In such an arrangement, the group of battery cells within the battery pack 212 may be associated with a single cell selection algorithm function 764 and a single battery switch 762 such that the battery switch 762 can be selectively actuated to electrically connect or electrically disconnect the group of battery cells from the active battery string 766. Therefore, the number of battery cells to be inserted or bypassed at a time using a single battery switch 762 may be selected based on the needs of the battery system.

In embedded designs, an A-D voltage converter 742 of the battery supervisory circuit 732 at each switchable battery module 770 (e.g., at the one or more battery cells) can serve as the voltage sensor to measure the voltage of the battery cells 772.

Detail C provides an enlargement of an example battery switch 762. The battery switch 762 may provide single pole, double throw (SPDT) switch functionality. Therefore, as illustrated, the battery switch 762 may be a SPDT switch where the pole (1P) can be connected to either the first throw (1T) to bypass the battery cell 772 (shunt switch position 762a) from the battery string 766 or the second throw (2T) to insert/activate the battery cell 772 (series switch position 762b) by including it in series with the battery string 766. Each of the plurality of battery switches 762 can use low voltage MOSFETs with low series resistance to improve efficiency, which can be provided in small packages. The battery switch 762 can be implemented with MOSFET, mechanical relays, reed switches, or IGBT switches (or another form of solid-state switch) in a break-before-make (BBM or non-shorting) arrangement, which interrupts one circuit before closing the other, thereby mitigating any risk of shorting the battery cell 772 being switched. For example, the battery switch 762 may be provided using back-to-back FETs (e.g., N-MOSFETS) in common source configuration, TRIACs (a three terminal semiconductor device), bipolar junction transistors (BJT), etc.

Therefore, in one aspect, a reconfigurable battery system, such as the battery pack 212, may include a plurality of switchable battery modules 770, a battery supervisory circuit 732, and a battery pack controller 730. The plurality of switchable battery modules 770 are electrically arranged in series to define a battery string 766 defining an output voltage for the battery pack 212 (e.g., a variable output voltage), each of the plurality of switchable battery modules 770 comprising a battery (e.g., a battery cell 772) and a battery switch 762. Configuring the battery switch 762 in the first position (e.g., series switch position 762b) electrically places the battery in series with the battery string 766 to increase the output voltage, while configuring the battery switch 762 in the second position (e.g., shunt switch position 762a) electrically bypasses the battery from the battery string 766. The battery supervisory circuit 732 is operably coupled to each of the plurality of switchable battery modules 770, wherein the battery supervisory circuit 732 is configured to monitor, for each of the plurality of switchable battery modules 770, one or more parameters of the battery. The battery pack controller 730 operably coupled to the battery supervisory circuit 732 to selectively switch, for each of the plurality of switchable battery modules 770, the battery switch 762 between the first position and the second position based at least in part on the one or more parameters of the battery and in accordance with a predetermined switching routine such that the output voltage is substantially equal to a predetermined target output voltage.

Using the example illustrated in FIG. 7c, certain battery cells 772 may be selectively bypassed based on, for example, their charge state to provide a desired string voltage. For example, if a string voltage of at least 10 volts is needed (a predetermined target output voltage), switchable battery modules 770 1, 3, and 4 may be activated to provide 10.29 volts (i.e., 3.43 v+3.19 v+3.67 v), while the remainder are bypassed. As the voltages of the battery cells 772 of first, third, and fourth switchable battery modules 770 (1, 3, and 4) decrease during the discharge cycle (or increase during a charge cycle), one or more of the second, fifth, and sixth switchable battery modules 770 (2, 5, and 6) may be selectively activated or deactivate (e.g., one by one) to maintain a string voltage of at least 10 volts. Alternatively, a different group of switchable battery modules 770 may be activated to maintain the predetermined target output voltage. Therefore, the battery pack controller 730 may be configured to switch the battery switch 762 of each of the plurality of switchable battery modules 770 individually (i.e., one-by-one) until the predetermined target output voltage is achieved at the variable voltage output.

A battery pack 212 for the solar-powered aircraft 100a, 100b may comprise, for example, a battery string 766 with 32 battery cells 772, which may be prismatic, cylindrical, or pouch cells. Therefore, as illustrated, each switchable battery module 770 within the battery pack 212 may employ a cell selection algorithm function 764 and a battery switch 762 to electrically connect or electrically disconnect (bypass) a battery cell 772 from the active battery string 766, thereby adjusting the voltage of the battery string 766 one battery cell 772 at a time. Nominally, about 75% of the battery cells 772 may be active across the battery pack 212 at a given time, where fewer battery cells 772 are active at start of discharge because voltage of the battery cells 772 are higher at that time. As can be appreciated, as the voltage of the battery cells 772 decreases toward the end of discharge, additional battery cells 772 are needed to maintain the programmed voltage. Therefore, the battery pack 212 can be configured and sized such that all available energy is utilized at worst case (longest night) time of year.

All battery pack assemblies 202 in a single battery bank 224 can be programmed simultaneously. To achieve the high bus voltages, each battery pack assembly 202 may employ at least about 100 battery cells 772 and provided a usable voltage of about 2.75V to 4.3V per battery cell 772. Battery pack assemblies 202 of more than 100 battery cells 772 in series are also contemplated for added capacity. Therefore, the battery pack assemblies 202 for the solar-powered aircraft 100a, 100b may comprise, for example, 10 to 1,000 battery cells 772, more preferably about 50 to 500 battery cells 772, even more preferably, about 75 to 300 battery cells 772, most preferably, about 100 to 200 battery cells 772. The bus voltage can be set dynamically in response to varying mission and aircraft conditions. For example, the bus voltage of the external bus can be reduced to increase drive system efficiency for night time and low altitude flight, to compensate for line drop when powering remote motors (via boom cross-tie switch(es) 304a, 304b) in the event of motor failure, or to implement MPPT.

The internal reconfiguration of the battery cell 772, via the battery supervisory circuit 732 in the battery pack 212, provides: (1) adjustable bus voltage during charge and discharge; (2) tolerance to battery cell failures; (3) lossless cell balancing during charge and discharge; (4) extended latitude reach or life through rest period; and (5) more accurate battery state estimation. For example, the battery pack 212 may employ a plurality of battery switches 762 to provide controlled access to individual battery cells 772 in the battery pack's 212 battery string 766. Generally, the number of active ("online") battery cells 772 is greater than (or equal to) the maximum bus voltage, divided by the minimum voltage of the battery cells 772. Using this approach, only a subset of battery cells 772 are charged or discharged at a given time, while the other cells are disconnected/rested (bypassed).

Traditional battery packs are vulnerable to even a single battery-cell failure, rendering the battery pack unusable and forfeiting the remaining energy still in the viable (i.e., good/usable) batteries. A programmable voltage architecture, however, provides the ability to bypass a defective battery cell 772 in the battery string 766 in accordance with a predetermined switching routine, thereby resulting in a battery pack 212 that is immune to battery and battery cell failures. Even multi-battery and multi-cell failures do not render the battery string 766 unusable and do not degrade battery pack capacity (except for the availability of the lost battery cells 772 that may be bypassed) until failure count of battery cells 772 accounts for a significant percentage of the total battery count. Such architecture allows for full utilization of the capacity of all viable battery cells in the battery pack 212.

In addition to cell failure, as battery cells age over time (and multiple charge/discharge cycles), the impedance/resistance, and capacity degrade and battery cell characteristics diverge. Premature degradation of even a single battery cell can bring down a traditional pack, resulting in wasted energy trapped in remaining good cells. The battery supervisory circuit 732, however, tracks impedance/resistance and capacity of each battery cell 772 over time. Accordingly, the battery pack 212 can implement preventive measures against cell degradation (or further cell degradation) by balancing the loading across the most viable battery cells. This implementation ensures that, absent an unexpected failure or defect, battery cells are constantly balanced and degrade at equal rate. The battery supervisory circuit 732 can therefore maximizes the capacity of the battery pack 212 (and therefore, the battery pack assembly 202/battery bank 224) over its expected/usable lifetime without dissipating excessive energy in battery cell balancing schemes. Accordingly, all available charge is used, but distributed over a larger population of battery cells.

When the battery cell 772 is out of the battery string 766 (i.e., bypassed), the battery's 772 SoC can be determined by measuring the battery's 772 open circuit voltage (OCV). When the battery cell 772 is in the battery string 766, the battery's 772 SoC can be estimated by measuring the in-and-out-flowing current. One technique for estimating the SoC of a battery cell 772 using the in-and-out-flowing current is known as the coulomb counting method (also known as ampere hour counting and current integration). The coulomb counting method employs battery current readings mathematically integrated over the usage period to calculate SoC values, which can be given by the equation:

$$SoC = SoC(t_0) + \frac{1}{C_{rated}} \int_{t_0}^{t_0+\tau} (I_b - I_{loss}) dt$$

where $SoC(t_0)$ is the initial SoC, $C_{rated}$ is the rated capacity, $I_b$ is the battery current, and $I_{loss}$ is the current consumed by the loss reactions. The coulomb counting method then calculates the remaining capacity simply by accumulating the charge transferred in or out of the battery.

When a bypassed battery cell 772 is selected and switched into the battery string 766, its internal impedance/resistance can be inferred by measuring the initial drop in cell voltage from the open-circuit (bypassed) to the closed-circuit (enabled or active) condition. Tracking the impedance/resistance of the battery cell 772 over time can be used as part of the SoH estimation to predict when a battery cell 772 is failing at a higher rate than other battery cells 772 in the battery string 766. Battery cell 772 with a higher rate of increasing impedance/resistance could be selected for use less frequently than healthier battery cells 772 (those with lower impedance/resistance) to allow all battery cells 772 to degrade at approximately the same rate and maximize usable lifetime of the complete battery string 766.

The power bus external to the battery system (e.g., battery pack 212, battery pack assembly 202, battery banks 224, battery array 200, etc.) if typically coupled to other electrical devices that can draw and/or supply current, such as an electric load 220, solar panels 106/solar array 226, etc. The voltage of the external bus is not controlled during operation, therefore a large in-rush or out-rush of current can occur whenever an electrical switch (whether a relay, solid-state switch, etc.) closes between the battery system and the external bus to place the battery "online". Therefore, the configuration of FIG. 7a incorporates, via its bus output switches 768, a pre-charge switch 702 having an inline resistor to limit in-rush or out-rush currents between the battery and bus. In operation, closing the pre-charge switch 702 allows the voltage to equalize such that the current will not be excessive when the top switch 704 is closed to put the battery online. The pre-charge switch 702, however, may not be sufficient in situations where the resistor and/or the top switch 704 is subject to very high current.

Further, maintaining load and charge balancing across the packs or assemblies can difficult in applications involving multiple batteries in parallel. As explained above, this may be achieved by changing the number of battery cells 772 coupled electrically in series to form a battery string 766, thereby adjusting the voltage of the overall battery pack 212. In other words, the voltage of a reconfigurable battery can be varied to maintain peak power collection on a solar panel 106/solar array 226 by internally changing the number of battery cells 772 in the battery string 766. This configuration has the advantage of reducing the system loss compared to other applications, such as those where a separate maximum power point tracking (MPPT) circuit is implemented (usually as a DC-to-DC converter).

A reconfigurable battery arrangement can still result in some loss, however. For example, the MPPT accuracy of a reconfigurable battery is somewhat limited because the reconfigurable battery is able to adjust the voltage only as voltage increments of a battery cell 772. In other words, the voltage increments are at the granularity of one battery cell voltage. Consequently, balancing can be fairly coarse and one battery pack 212 will typically have a higher current than battery packs. With a reconfigurable battery, it can be difficult to manage the voltage precisely and, consequently the reconfigurable battery can be subject to excessive current.

Figure 8:
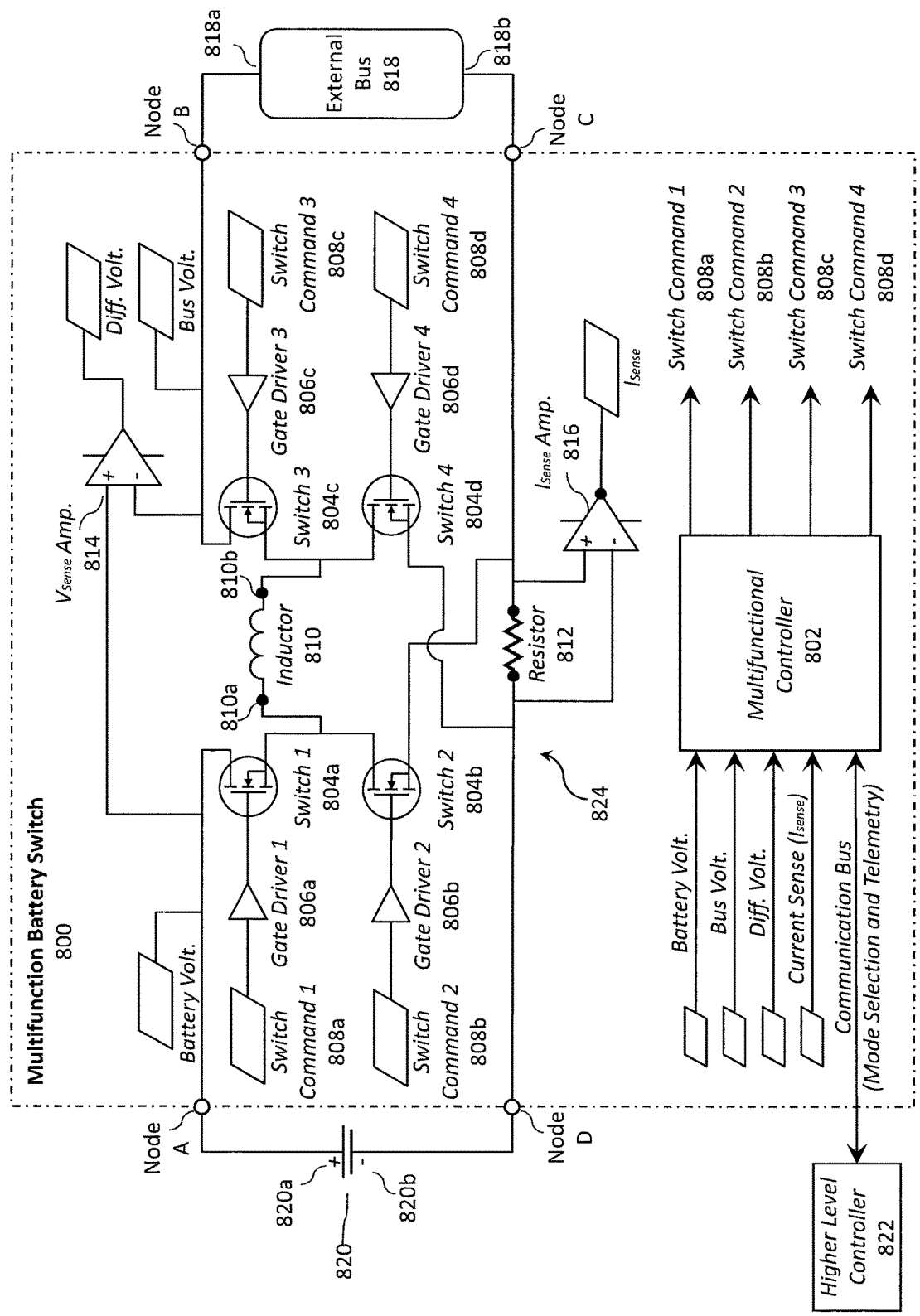
FIG. 8 illustrates a multifunction battery switch in accordance with a first aspect.

In view of the foregoing, a multifunction battery switch 800, an example of which is illustrated in FIG. 8, may be used to selectively connect a battery 820 to an external bus 818. The external bus 818, in turn, may be coupled to an electric load, solar array, power source, etc. for charging and discharging of the battery 820. The multifunction battery switch 800 may be provided in lieu of, or in addition to, the bus output switches 768 described in connection with FIG. 7a. The battery 820 may be a reconfigurable battery or a reconfigurable battery system, such as the battery pack 212, the battery pack assembly 202, the battery array 200, etc. While described primarily in connection with a reconfigurable battery, the multifunction battery switch 800 may also be used with a traditional battery (i.e., a non-reconfigurable battery) or a traditional battery system.

The multifunction battery switch 800 generally comprises a plurality of switches 804a, 804b, 804c, 804d (Switch 1 through Switch 4), an inductor 810, and resistor 812 arranged to yield a buck-boost converter 824. The multifunction battery switch 800 further comprise a multifunctional controller 802 configured to drive the switches 804a, 804b, 804c, 804d of the buck-boost converter 824 via one or more gate drivers 806a, 806b, 806c, 806d. A buck-boost converter 824 is a type of DC-to-DC converter circuit that has an output voltage magnitude that is either greater than or less than the input voltage magnitude. The arrangement of the buck-boost converter 824 provides the ability for the multifunction battery switch 800 to selectively increase or decrease voltage into or out of the battery 820.

Each of the plurality of switches 804a, 804b, 804c, 804d may be a solid-state switch (e.g., a field-effect transistor (FET)) having a source, a drain, and a gate. In operation, a voltage is applied to the gate (e.g., via a gate driver 806a, 806b, 806c, 806d) to selectively start and stop the flow of current between the source and the drain. Specifically, when a voltage is applied to the gate, the switch 804a, 804b, 804c, 804d is closed, thereby allowing current to flow between the source and the drain. While each of the plurality of switches 804a, 804b, 804c, 804d is described and illustrated as a FET, other solid-state switches are contemplated, including relays, silicon MOSFET, silicon carbide (SiC) FET, or IGBT.

Therefore, in one aspect, the plurality of switches 804a, 804b, 804c, 804d may comprise a first switch 804a, a second switch 804b, a third switch 804c, and a fourth switch 804d. The first switch 804a is configured to pass current between a first inductor terminal 810a of the inductor 810 and a first battery terminal 820a of the battery pack 820. The second switch 804b is configured to pass current between the first inductor terminal 810a of the inductor 810 and a second battery terminal 820b of the battery pack 820 (e.g., via resistor 812). The third switch 804c is configured to pass current between a second inductor terminal 810b of the inductor 810 and a first bus terminal 818a of the external bus 818. The fourth switch 804d is configured to pass current between the second inductor terminal 810b of the inductor 810 and a second bus terminal 818b of the external bus 818 (e.g., via resistor 812).

The multifunction battery switch 800 may further comprise a voltage sense ($V_{Sense}$) amplifier 814, a current sense ($I_{Sense}$) amplifier 816, and a plurality of voltage sensors. The $V_{Sense}$ amplifier 814 outputs a differential voltage measurement representing a differential voltage between the battery voltage (i.e., the voltage across the battery 820) and the bus voltage (i.e., the voltage across the external bus 818), while the $I_{Sense}$ amplifier 816 provides a current measurement ($I_{Sense}$) representing a current through the resistor 812.

The $I_{Sense}$ current through the resistor 812 may be determined by measuring via a voltage sensor the voltage across the resistor 812 (i.e., the $I_{Sense}$ voltage), which has a known resistance. For example, one of the plurality of voltage sensors may be configured to measure the voltage across the resistor 812. In certain aspects, current sensing may also be achieved by measuring voltage across the inductor 810, switches 804a, 804b, 804c, 804d, or other components within the multifunction battery switch 800. To that end, voltage sensors may be configured throughout the multifunction battery switch 800 to measure the voltage across the battery 820 (i.e., a battery voltage measurement), external bus 818 (i.e., a bus voltage measurement), inductor 810 (i.e., an inductor voltage measurement), switches 804a, 804b, 804c, 804d (i.e., a switch voltage measurement), etc. The various current and voltage measurements may be determined (e.g., measured and/or calculated) and communicated to the multifunctional controller 802 for processing as measurement inputs.

The arrangement of the resistor 812 enables the multifunction battery switch 800 to sense the current delivered to either the external bus 818 (during discharge) or to the battery 820 (during charge). By design, the resistor 812 does not sense current from the source used to charge the inductor 810 during step-up/step-down operation. In certain aspects, the resistor 812 may be replaced by another current-sensing device to provide the current measurement, such as a hall-effect sensor.

The multifunctional controller 802 controls the overall operation of the multifunction battery switch 800. In operation, the multifunctional controller 802 outputs, inter alia, switch commands 808a 808b, 808c, 808d to control operation of the multifunction battery switch 800 as a function of one or more measurement inputs. For example, the multifunctional controller 802 may receive (e.g., in real-time or near real-time), as inputs, current measurements (e.g., $I_{Sense}$), battery voltage measurements, bus voltage measurements, differential voltage measurements, other voltages (e.g., $I_{Sense}$, inductor, and switch voltage measurements), etc.

The multifunctional controller 802 may be implemented as a microcontroller, microprocessor, system on module, or a field-programmable gate array (FPGA) integrated circuit (IC). In certain aspects, a single controller (e.g., processor and any associated circuitry) may serve as both the multifunctional controller 802 and the controller for the reconfigurable battery or reconfigurable battery system, such as the battery pack controller 730, MCU 708, etc. The multifunctional controller 802 may also be communicatively coupled with a higher level controller 822, such as system controller 216. For example, the multifunctional controller 802 may receive control commands from the higher level controller 822 and/or provide feedback (e.g., measurement, current settings, etc.) to the higher level controller 822.

Each of the switches 804a, 804b, 804c, 804d may be selectively and individually driven (e.g., actuated) via a gate driver 806a, 806b, 806c, 806d in response to a switch command 808a, 808b, 808c, 808d from the multifunctional controller 802. Specifically, a first switch 804a (Switch 1) may be selectively actuated via a first gate driver 806a (Gate Driver 1) in response to a first switch command 808a (Switch Command 1), a second switch 804b (Switch 2) may be selectively actuated via a second gate driver 806b (Gate Driver 2) in response to a second switch command 808b (Switch Command 2), a third switch 804c (Switch 3) may be selectively actuated via a third gate driver 806c (Gate Driver 3) in response to a third switch command 808c (Switch Command 3), and a fourth switch 804d (Switch 4) may be selectively actuated via a fourth gate driver 806d (Gate Driver 4) in response to a fourth switch command 808d (Switch Command 4). In certain aspects, the switch command 808a, 808b, 808c, 808d may use pulse width modulation (PWM) control techniques to control one or more of the switches 804a, 804b, 804c, 804d and to adjust the switching duty cycle (e.g., to enable step-up or step-down voltage adjustments). The multifunction battery switch 800 enables control of the current into and out of the battery 820 in multiple scenarios without increasing the switch loss of the multifunction battery switch 800 and without using resistors to control in-rush/out-rush current (e.g., as described in connection with pre-charge switch 702).

The multifunctional controller 802 is operable to selectively control the switches 804a, 804b, 804c, 804d of the buck-boost converter 824 to achieve multiple switching states, including: an online state, an offline state, a discharge-only state, a charge-only state, a step-down discharge state, a step-up discharge state, a step-down charge state, and a step-up charge state. The various switching states can facilitate various functions, including, a maximum power point tracking, a current controlled charging/discharging, ideal diode operation, current balancing, and soft start/soft stop.

Maximum Power Point Tracking.

To facilitate maximum power point tracking, the multifunctional controller 802 may vary the switching duty cycle of a switch (e.g., one or more of switches 804a, 804b, 804c, 804d) via PWM to maximize the power transfer from the power source connected to the external bus 818 to the battery 820 using one or more algorithms, such as a perturb-and-observe algorithm.

Current Controlled Charging/Discharging.

Effective battery charging typically requires controlling the current flowing into the battery 820. For example, lithium batteries are typically charged in two phases starting with a constant current phase up until the battery cells 772 reach a state-of-charge threshold, then followed by a constant voltage phase to complete the charge cycle while minimizing degradation of the battery cell(s) 772. When charging from a traditional power supply, the multifunctional controller 802 can mimic a traditional battery charge using a constant-current charge until the threshold is reached, followed by a constant-voltage charge until the battery cells 772 are fully charged. The constant-current phase and constant-voltage phase can be achieved by varying the switching duty cycle of one or more of switches 804a, 804b, 804c, 804d via PWM as necessary to maintain a desired current or voltage at the battery 820 (as appropriate).

When charging from a solar power source (e.g., a solar panel 106, solar array 226, etc.), at noted above, the multifunctional controller 802 may employ a MPPT algorithm to maximize power transfer as long as the charge current limit is not exceeded. If the current limit is exceeded, the multifunctional controller 802 may decrease the switching duty cycle of the switch(es) to limit the charge current, thus moving away from the peak power point on the solar array. Once the state-of-charge threshold is achieved the multifunctional controller 802 can control charge voltage using the switching duty cycle of the switch(es) to ensure the battery 820 reaches a maximum charge.

Ideal Diode Operation.

The multifunctional controller 802 can be also configured to operate one or more of switches 804a, 804b, 804c, 804d such that a switch functions as an ideal diode, which can then be used to facilitate charge-only and discharge-only operation. In this mode, when the multifunctional controller 802 senses current in the allowed direction the switch transitions to the closed position to minimize resistance to the current flow. Conversely, when the multifunctional controller 802 senses current trying to flow in the disallowed (i.e., prohibited) direction, the switch transitions to the open position to interrupt the flow. This mode can be advantageous over normal diodes because FET switches 804a, 804b, 804c, 804d have lower losses than traditional diodes.

Current Balancing.

When multiple battery packs 212 are connected in parallel, the controllers associated with each of the battery packs 212 (e.g., battery pack controllers 730) can work collaboratively to balance current between the battery packs 212. Using a communications channel, each of the parallel controllers can transmit its current periodically to all of the other controllers. At each time step, each controller calculates the average current across all of the connected packs and then adjusts its switching duty cycle to achieve a current closer to the average. The controller associated with each of the battery packs 212 will respect its own maximum current limits while attempt to balance with the other battery packs 212, which may have different current limits. This functionality is available during both charge and discharge of the battery pack.

Soft Start/Soft Stop.

During soft-start operation, the multifunctional controller 802 senses the voltage on both sides of the multifunction battery switch 800 and ramps the switching duty cycle of the switch(es) 804a, 804b, 804c, 804d to equalize the voltage across the multifunction battery switch 800 without experiencing a large current spike. During soft-stop operation the multifunctional controller 802 will ramp down the switching duty cycle of the switch(es) 804a, 804b, 804c, 804d to reduce the current to zero smoothly.

Example switch positions for the switches 804a, 804b, 804c, 804d during the various switching states are summarized below in Table A.

TABLE A

| | Switch Position | | | |
| --- | --- | --- | --- | --- |
| Switching State | Switch 1 804a | Switch 2 804b | Switch 3 804c | Switch 4 804d |
| Online | Closed | Open | Closed | Open |
| Offline | Open | Open | Open | Open |
| Discharge Only | Closed | Open | Closed IF (current out ≥ 0) | Open |

TABLE A-continued

| Switching State | Switch 1 804a | Switch 2 804b | Switch 3 804c | Switch 4 804d |
|---|---|---|---|---|
| Charge Only | Closed IF (current in ≥ 0 AND bus voltage ≤ battery voltage) | Open | Closed IF (current in ≥ 0 AND bus voltage ≤ battery voltage) | Open |
| Step-down Discharge | PWM Control | Inverse of Switch 1 (BBM Protection) | Closed | Open |
| Step-up Discharge | Closed | Open | Inverse of Switch 4 (BBM Protection) | PWM Control |
| Step-down Charge | Closed | Open | PWM Control | Inverse of Switch 3 (BBM Protection) |
| Step-up Charge | Inverse of Switch 2 (BBM Protection) | PWM Control | Closed | Open |

The online and offline switching states provide basic battery switching functionality. Specifically, the multifunction battery switch 800 can be used to switch the battery 820 between an online state where the battery 820 is connected to the external bus 818 and offline state where the battery 820 is disconnected from the external bus 818. In the online switching state, switch 1 804a and switch 3 804c are in a closed position (i.e., conducting) and switches 2 and 4 are in an open position (i.e., non-conducting) such that current flows freely between the battery 820 and external bus 818. Specifically, current flows (1) between node A and node B via switch 1 804a, switch 3 804c, and inductor 810 and (2) between node C and node D via resistor 812. The direction of current flow will depend on whether the battery 820 is being charged by a power supply coupled to the external bus 818, or discharged to a load that is coupled to the external bus 818.

In the offline state, each of the switches 804a, 804b, 804c, 804d are in the open position, though it is possible to disconnect the battery 820 by switching only one of switch 1 804a or switch 3 804c to the open position. Specifically, placing switch 1 804a and/or switch 3 804c in an open position breaks the current path between node A and node B, thus disconnecting the battery 820 from the external bus 818. The architecture of the multifunction battery switch 800 enables switching between the online and offline states with nominal overhead and losses beyond the switch(es). In the online state, the only additional loss is the series resistance of the inductor 810.

In certain aspects, it may be desirable to provide a charge-only and/or discharge-only modes of operation to control current flow into or out of the battery 820.

In a discharge-only switching state, switch 2 804b and switch 4 are configured in an open position, while switch 1 804a is maintained in a closed position. Switch 3 804c may be selectively opened and closed (via multifunctional controller 802) as a function of the current out of the battery 820, the bus voltage, and the battery voltage. Specifically, switch 3 804c is positioned in a closed position by multifunctional controller 802 if the following two condition are met: (1) the current out of the battery 820 is greater than 0 amps; and (2) the bus voltage across the external bus 818 is less than or equal to the voltage across the battery 820. When switch 3 804c is in the closed position under these conditions, current flows from node A to node B via switch 1 804a, switch 3 804c, and inductor 810. Placing switch 3 804c is in the open position breaks the current path between node A and node B, thus disconnecting the battery 820 from the external bus 818 and preventing charging of the battery 820.

In a charge-only switching state, switch 2 804b and switch 4 are configured in an open position, while switch 3 804c is maintained in a closed position. Switch 1 804a may be selectively opened and closed (via multifunctional controller 802) as a function of the current out of the battery 820, the bus voltage, and the battery voltage. Specifically, switch 1 804a is positioned in a closed position by multifunctional controller 802 if the following two condition are met: (1) the current into the battery 820 is greater than 0 amps; and (2) the bus voltage across the external bus 818 is greater than or equal to the voltage across the battery 820. When switch 1 804a is in the closed position under these conditions, current flows from node B to node A via switch 1 804a, switch 3 804c, and inductor 810. Placing switch 3 is in the open position breaks the current path between node A and node B, thus disconnecting the battery 820 from the external bus 818 and preventing discharging of the battery 820.

In certain aspects, it may be desirable to step-up or step-down the voltage across the multifunction battery switch 800 via the switches 804a, 804b, 804c, 804d during charge or discharge of the battery 820.

Figure 9A:
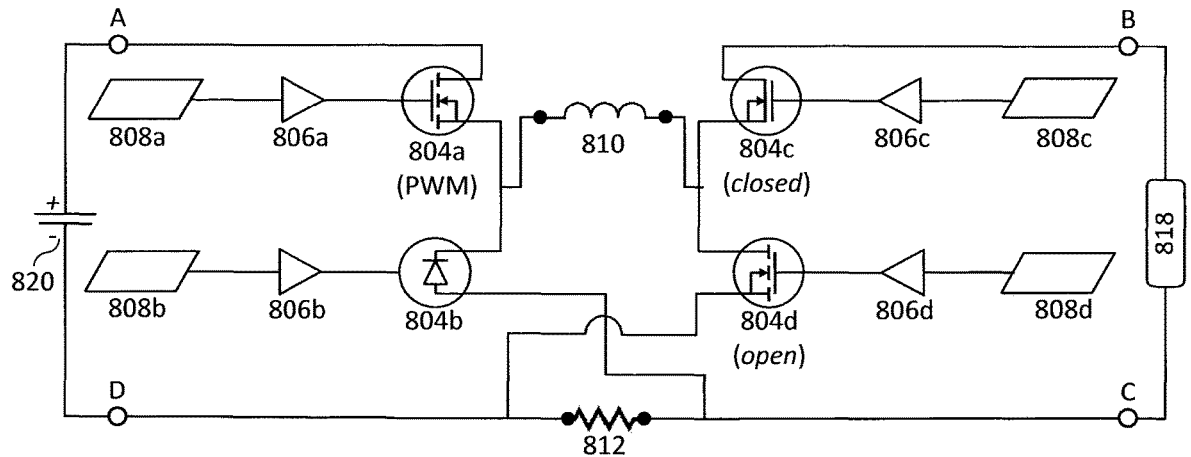
FIGS. 9a through 9c illustrate the multifunction battery switch in a voltage step-down discharge arrangement.
Figure 9B:
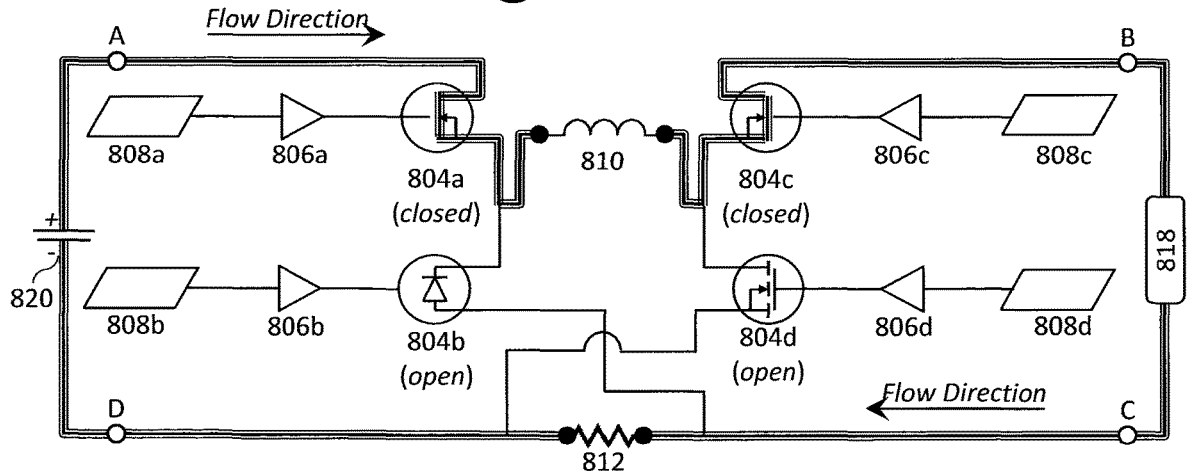
Figure 9C:
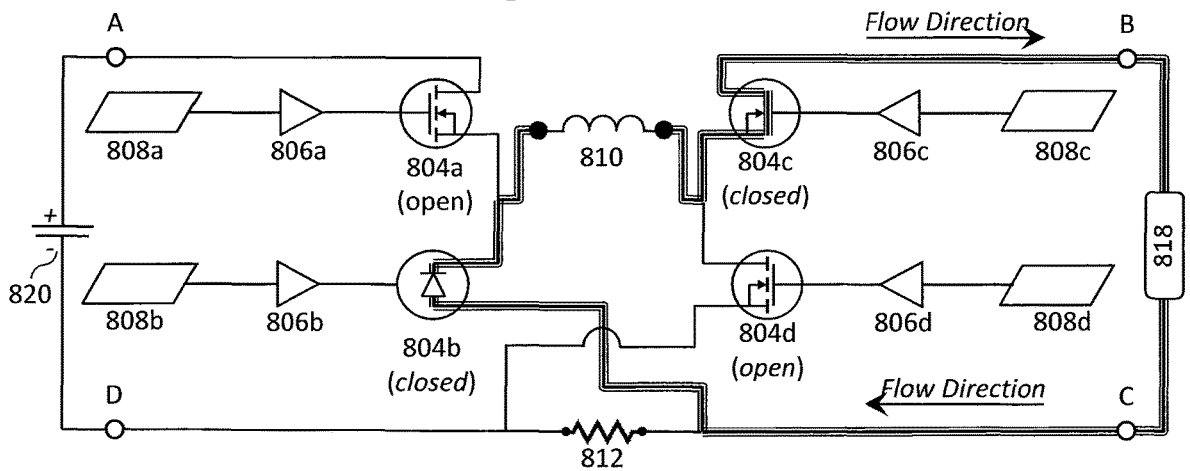

An example step-down discharge switching state is illustrated in FIGS. 9a through 9c. The step-down discharge switching state may be used to facilitate, for example, soft start/soft stop discharge and/or current-controlled discharge. As illustrated in FIG. 9a, switch 3 804c is maintained in a closed position and switch 4 804d is maintained in an open position. Switch 1 804a may be controlled (i.e., opened and closed) using pulse width modulation to achieve a desired voltage step-down, where switch 2 804b is controlled as a function of the switch state of switch 1 804a. Specifically, the switch position of switch 2 804b will be the inverse of the switch position of switch 1 804a, such that switch 2 804b effectively operates as a diode. For example, when switch 1 804a is in a closed position, switch 2 804b will be in an open position. Switches 1 and 2 804a, 804b may employ break-before-make (BBM) protection during transition between the open position and the closed position, which interrupts one circuit before closing the other to avoid a shoot through of current. In other words, if switch 1 804a is transitioning from the open position to the closed position, switch 2 804b will switch to the open position before switch 1 804a switches to the closed position (and vice versa).

FIG. 9b illustrates the flow of current when switch 1 804a is in a closed position and switch 2 804b is in an open position (i.e., the inverse of switch 1 804a). As illustrated, current flows from node A to node B via switch 1 804a, switch 3 804c, and inductor 810 and from node C to node D via resistor 812. FIG. 9c illustrates the flow of current when switch 1 804a is in the open position and switch 2 804b is in the closed position. As illustrated, current flows from node C to node B via switch 2 804b, inductor 810, and switch 3 804c. Placing switch 1 804a in the open position breaks the current path between node A and node B, thus disconnecting the battery 820 from the external bus 818 and preventing charging of the battery 820.

Figure 10A:
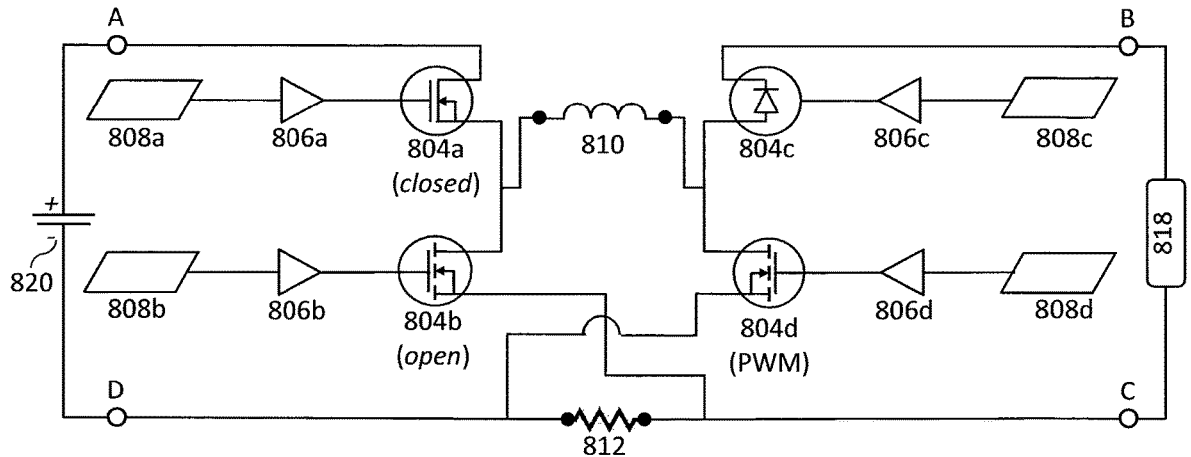
FIGS. 10a through 10c illustrate the multifunction battery switch in a voltage step-up discharge arrangement.
Figure 10B:
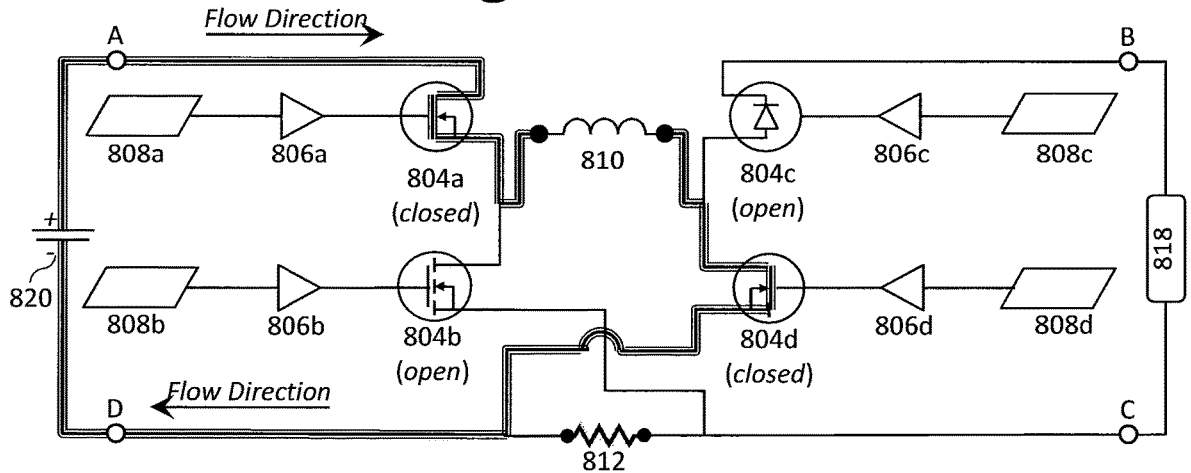
Figure 10C:
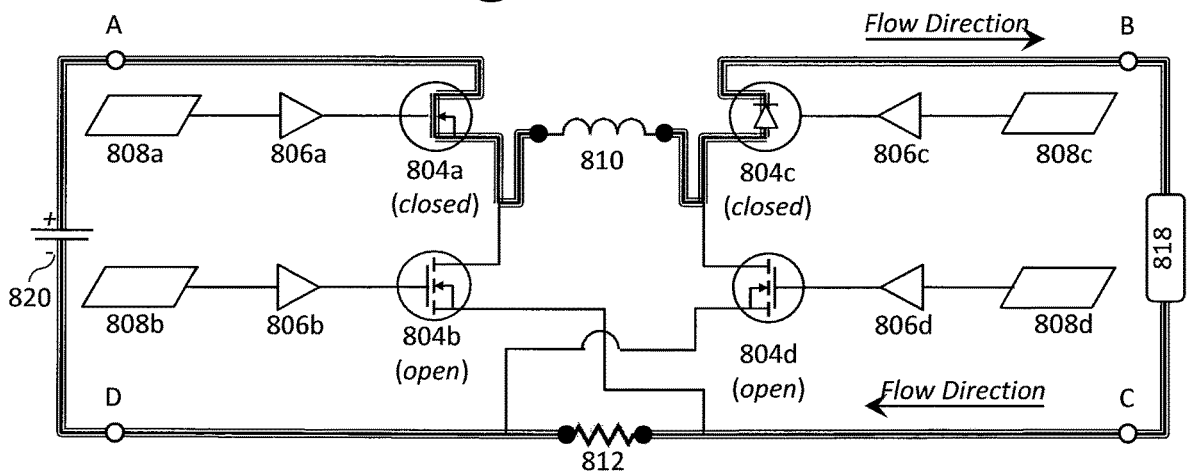

An example step-up discharge switching state is illustrated in FIGS. 10a-10c. The step-up discharge switching state may be used to facilitate, for example, current-controlled discharge. As illustrated in FIG. 10a, switch 1 804a is maintained in a closed position and switch 2 804b is maintained in an open position. Switch 4 804d may be controlled (i.e., opened and closed) using pulse width modulation to achieve a desired voltage step-up, where switch 3 804c is controlled as a function of the switch state of switch 4 804d. Specifically, the switch position of switch 3 804c will be the inverse of the switch position of switch 4 804d, such that switch 3 804c effectively operates as a diode. For example, when switch 4 804d is in a closed position, switch 3 804c will be in an open position. Switches 3 and 4 804c, 804d may employ BBM protection during transition to avoid a shoot through of current. In other words, if switch 4 804d is transitioning from the open position to the closed position, switch 3 804c will switch to the open position before switch 4 804d switches to the closed position (and vice versa).

FIG. 10b illustrates the flow of current when switch 4 804d is in a closed position and switch 3 804c is in an open position (i.e., the inverse of switch 4 804d). As illustrated, current flows from node A to node D via switch 1 804a, inductor 810, and switch 4 804d. Placing switch 4 804d in the closed position breaks the current path between node A and node B via switch 3 804c (as the inverse of switch 4 804d), thus disconnecting the battery 820 from the external bus 818 and preventing charging of the battery 820. FIG. 10c illustrates the flow of current when switch 4 804d is in the open position and switch 3 804c is in the closed position. As illustrated, current flows from node A to node B via switch 1 804a, switch 3 804c, and inductor 810 and from node C to node D via resistor 812.

Figure 11A:
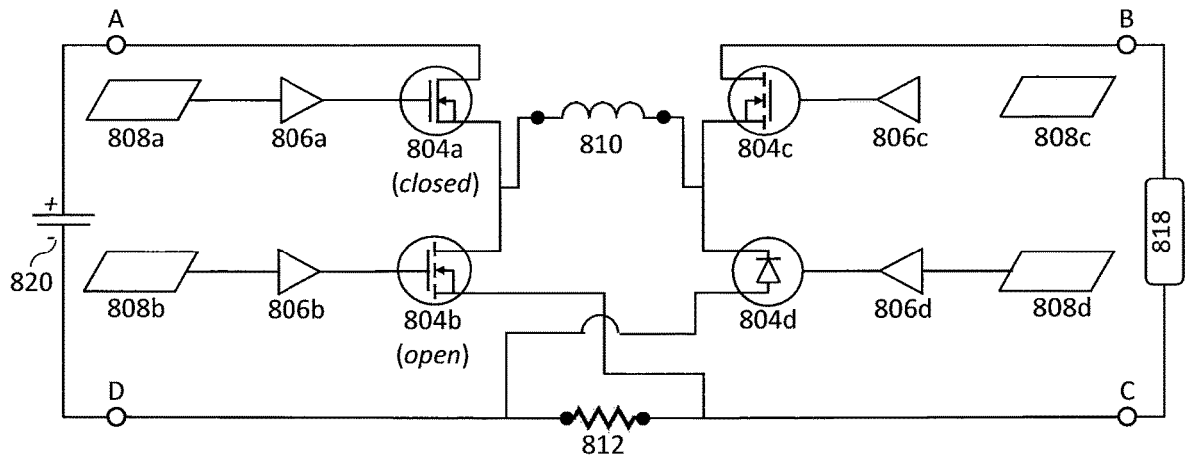
FIGS. 11a through 11c illustrate the multifunction battery switch in a voltage step-down charge arrangement.
Figure 11B:
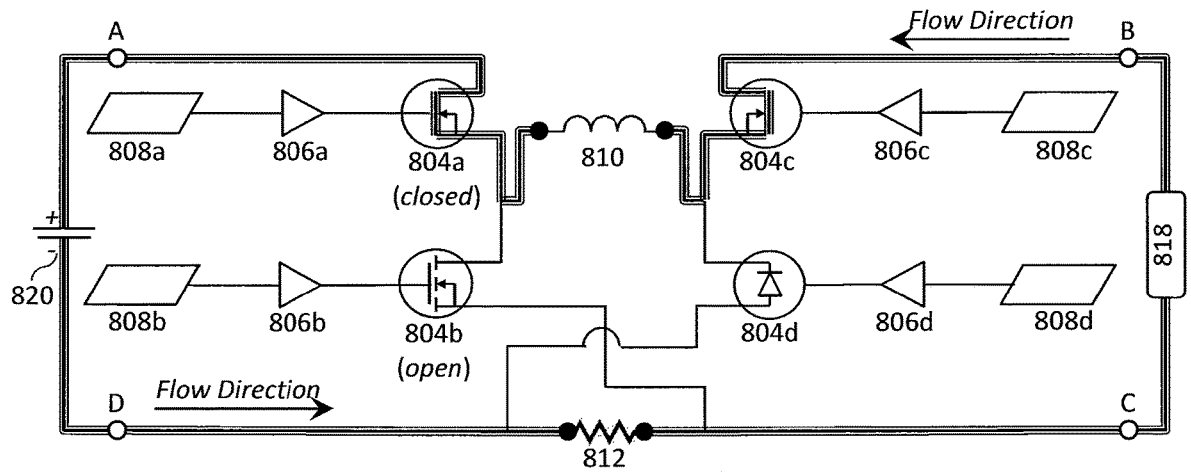
Figure 11C:
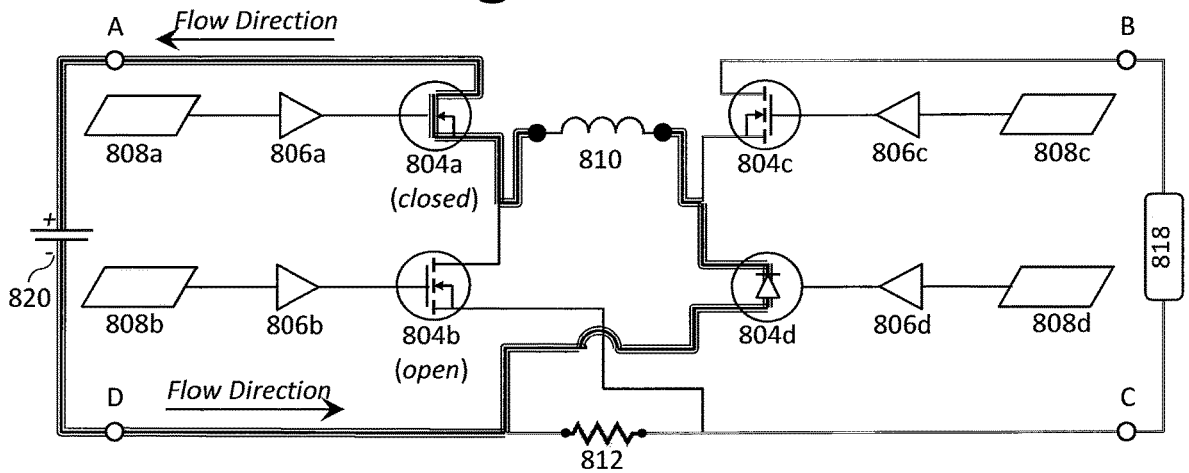

An example step-down charge switching state is illustrated in FIGS. 11a-11c. The step-down charge switching state may be used to facilitate, for example, soft start/soft stop charge, current-controlled charge, or MPPT. As illustrated in FIG. 11a, switch 1 804a is maintained in a closed position and switch 2 804b is maintained in an open position. Switch 3 804c may be controlled (i.e., opened and closed) using pulse width modulation to achieve a desired voltage step-down, where switch 4 804d is controlled as a function of the switch state of switch 3 804c. Specifically, the switch position of switch 4 804d will be the inverse of the switch position of switch 3 804c, such that switch 4 804d effectively operates as a diode. For example, when switch 3 804c is in a closed position, switch 4 804d will be in an open position. Switches 3 and 4 804c, 804d may employ BBM protection during transition between the open position and the closed position, which avoids a shoot through of current. In other words, if switch 3 804c is transitioning from the open position to the closed position, switch 4 804d will switch to the open position before switch 3 804c switches to the closed position (and vice versa).

FIG. 11b illustrates the flow of current when switch 1 804a is in a closed position and switch 3 804c is in an open position (i.e., the inverse of switch 1 804a). As illustrated, current flows from node B to node A via switch 1 804a, switch 3 804c, and inductor 810 and from node D to node C via resistor 812. FIG. 11c illustrates the flow of current when switch 1 804a is in the open position and switch 3 804c is in the closed position. As illustrated, current flows from node D to node A via switch 3 804c, inductor 810, and switch 1 804a. Placing switch 3 804c in the open position breaks the current path between node B and node A, thus disconnecting the battery 820 from the external bus 818 and preventing discharging of the battery 820.

Figure 12A:
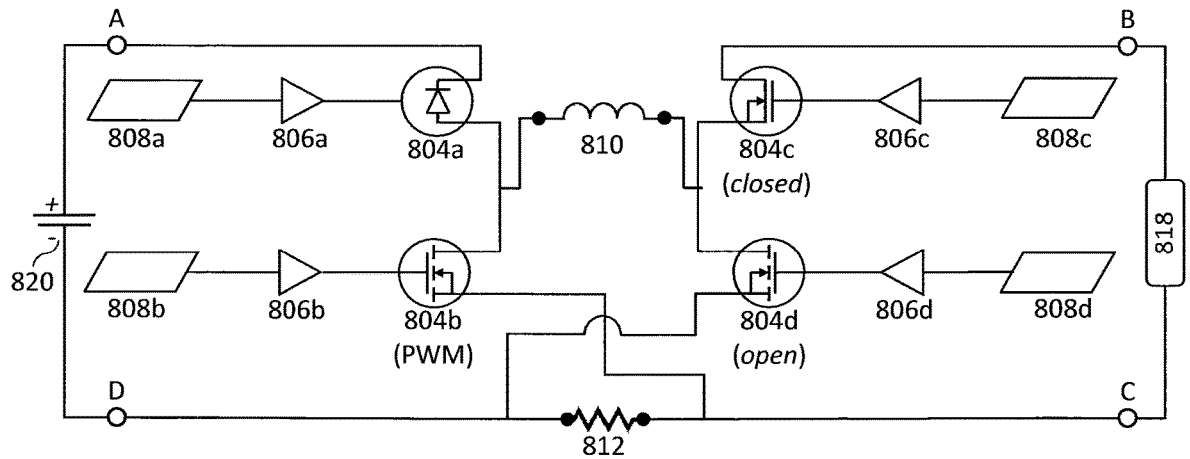
FIGS. 12a through 12c illustrate the multifunction battery switch in a voltage step-up charge arrangement.
Figure 12B:
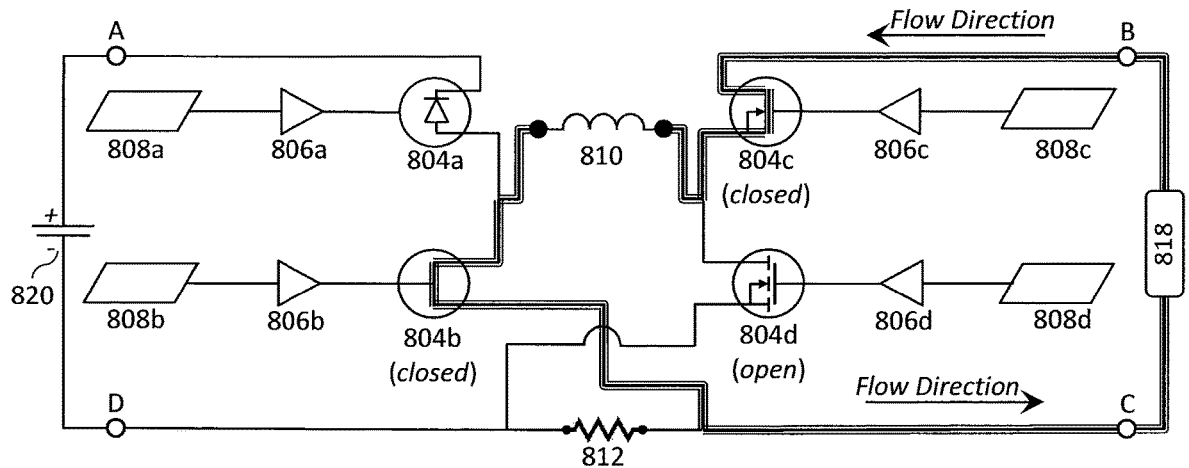
Figure 12C:
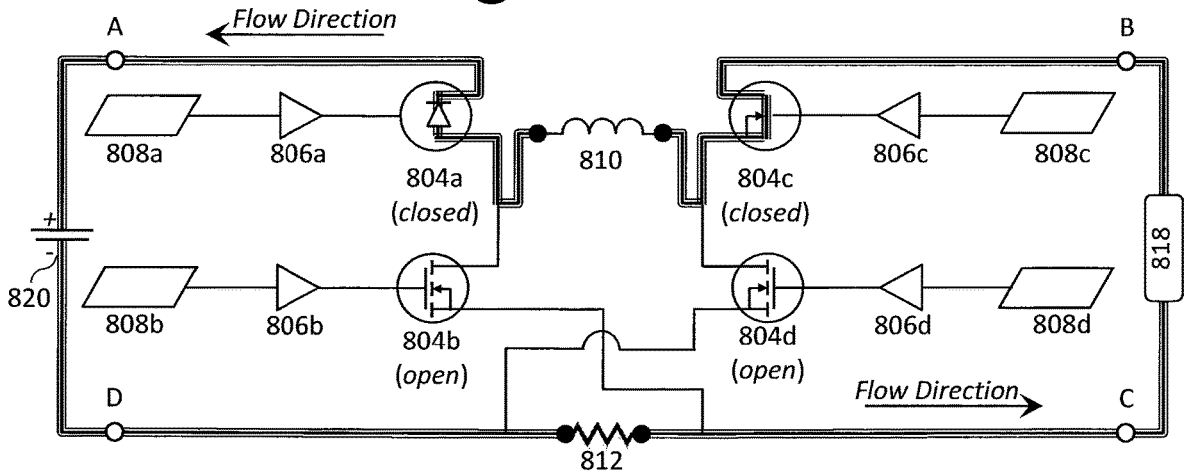

An example step-up charge switching state is illustrated in FIGS. 12a-12c. The step-up charge switching state may be used to facilitate, for example, the current-controlled charge or MPPT. As illustrated in FIG. 12a, switch 3 804c is maintained in a closed position and switch 4 804d is maintained in an open position. Switch 2 804b may be controlled (i.e., opened and closed) using pulse width modulation to achieve a desired voltage step-up, where switch 1 804a is controlled as a function of the switch state of switch 2 804b. Specifically, the switch position of switch 1 804a will be the inverse of the switch position of switch 2 804b, such that switch 1 804a effectively operates as a diode. For example, when switch 2 804b is in a closed position, switch 1 804a will be in an open position. Switches 1 and 2 804a, 804b may employ BBM protection during transition to avoid a shoot through of current. In other words, if switch 2 804b is transitioning from the open position to the closed position, switch 1 804a will switch to the open position before switch 2 804b switches to the closed position (and vice versa).

FIG. 12b illustrates the flow of current when switch 2 804b is in a closed position and switch 1 804a is in an open position (i.e., the inverse of switch 2 804b). As illustrated, current flows from node B to node C via switch 3 804c, inductor 810, and switch 2 804b. Placing switch 2 804b in the closed position breaks the current path between node A and node B via switch 1 804a (as the inverse of switch 2 804b), thus disconnecting the battery 820 from the external bus 818 and preventing discharging of the battery 820. FIG. 12c illustrates the flow of current when switch 2 804b is in the open position and switch 1 804a is in the closed position. As illustrated, current flows from node B to node A via switch 1 804a, switch 3 804c, and inductor 810 and from node D to node C via resistor 812.

The multifunctional controller 802 can work with (or incorporate) a battery pack controller 730 to optimize conversion efficiency of the buck-boost converter 824 when used with a reconfigurable battery. For example, the multifunctional controller 802 may simultaneously adjust the voltage of the battery 820 to match (or substantially match)

the peak power voltage of a power source (e.g., a solar panel 106, solar array 226, etc.) coupled to the external bus 818, thereby minimizing the power conversion losses of the buck-boost converter 824. In operation, the buck-boost converter 824 of the multifunction battery switch 800 can be used to implement more precise changes to the output voltage of a battery 820 than can be achieved using a reconfigurable battery alone.

That is, a reconfigurable battery is typically limited to changes at increments of its smallest switchable component (e.g., at increments of one battery cell 772). Where the smallest switchable component is a battery cell 772, the output voltage of a reconfigurable battery is adjusted at increments of one battery cell 772. The nominal voltage of the lithium-based battery cells is about 3.6 to 3.7 volts; therefore, assuming that the battery cell 772 is charged, the reconfigurable battery will adjust at increments of about 3.6 to 3.7 volts. It often desirable, however, to make fine adjustments that are smaller than the coarse adjustments afforded by switching a battery cell 772 online or offline. Therefore, in operation, the buck-boost converter 824 may be used to continuously implement fine adjustments to the output voltage of the battery 820 via the switches 804a, 804b, 804c, 804d, while the reconfigurable components of the battery 820 may be controlled to implement coarse adjustments to the output voltage (e.g., via the switchable battery modules 770).

By way of example, where a battery cell 772 having the lowest SoC within a battery string 766 exhibits a voltage of 3 volts, the smallest voltage increment for that reconfigurable battery is 3 volts. To make fine adjustments (in this case, less than 3 volts), the buck-boost converter 824 may function as a step-up or step-down converter. This may be accomplishing by driving one or more for the switches 804a, 804b, 804c, 804d using PWM control techniques to attain a switching duty cycle that implements the desired fine adjustment (whether a step-up or step-down adjustment). To that end, the buck-boost converter 824 may be used to implement desired fine adjustments to the output voltage of the battery 820 (e.g., at increments that are less than can be achieved by switching a battery cell 772 online or offline), while the reconfigurable battery may be used to implement desired adjustments at increments that can be achieved by switching battery cell(s) 772 online or offline.

This approach is advantageous since the conversion efficiency of the buck-boost converter 824 is maximized when there is no change in voltage across the buck-boost converter 824. Further, the buck-boost converter 824 can respond much more quickly than the reconfigurable battery can when implementing adjustments to the output voltage. Therefore, efficiency is optimized when using the buck-boost converter 824 to implement fine adjustments quickly, while the reconfigurable battery may be used to implement coarse changes.

Figure 13:
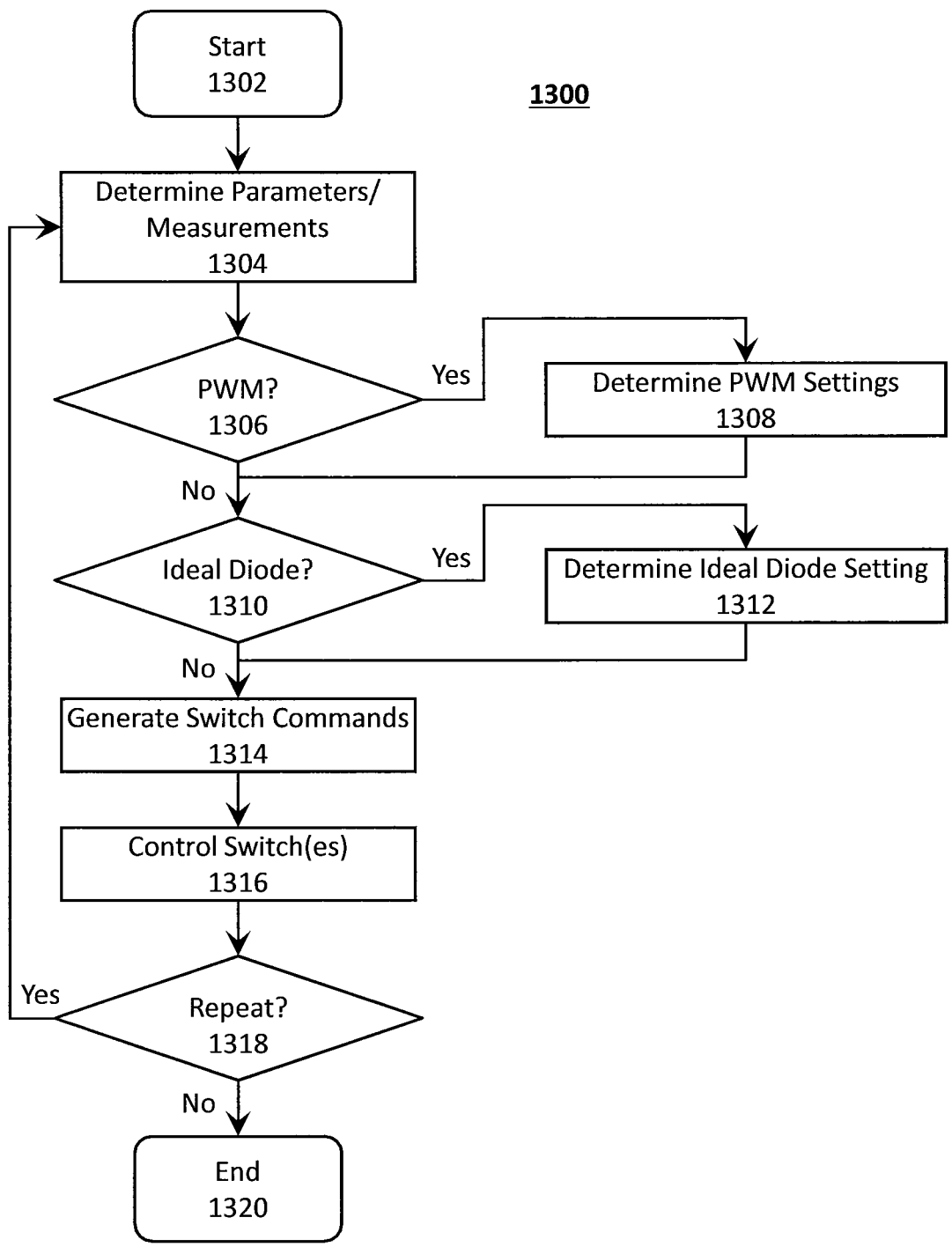
FIG. 13 illustrates an example method for selectively connecting a battery pack to an external bus.

FIG. 13 illustrates an example process 1300 for selectively connecting a battery 820 (e.g., battery pack 212) to an external bus 818. The process starts at step 1302. At step 1304, the multifunctional controller 802 determines one of more parameters of the multifunction battery switch 800. For example, the multifunctional controller 802 may measure (otherwise determine), via one or more sensors, one or more of (1) a current through the resistor 812 to yield a current measurement, (2) a voltage across the battery 820 to yield a battery voltage measurement, (3) a voltage across the external bus 818 to yield a bus voltage measurement, (4) a voltage across the inductor 810 to yield an inductor voltage measurement, (5) a voltage across the switches 804a, 804b, 804c, 804d to yield switch voltage measurements, (6) a differential voltage measurement between the battery voltage measurement and the bus voltage measurement, etc.

At step 1306, the multifunctional controller 802 optionally determines whether to employ one or more PWM control techniques in controlling the one of more of the solid-state switches 804a, 804b, 804c, 804d to, for example, implement step-up or step-down voltage adjustments to the power transfer. For example, if the battery 820 is a reconfigurable battery pack, the multifunctional controller 802 may be configured to implement a small adjustment to the output voltage of the battery 820 via the plurality of solid-state switches, where the large adjustments to the output voltage of the battery 820 are provided via a plurality of switchable battery modules 770, for example.

The multifunctional controller 802 may determine whether to employ one or more PWM control techniques based on measurements from step 1304 (e.g., to regulate power transfer as a function of real-time or near-real-time measurements associated with the of the battery 820, the external bus 818, etc.), instructions from a higher level controller 822, etc. If the multifunctional controller 802 determines that it will employ one or more PWM control techniques, the process 1300 proceeds to step 1308, otherwise the process 1300 proceeds to step 1310.

At step 1308, the multifunctional controller 802 determines which of the solid-state switches 804a, 804b, 804c, 804d will be controlled using PWM control techniques and, for each that will be controlled using PWM control techniques, a switching duty cycle to achieve a desired adjustment, voltage, etc.

At step 1310, the multifunctional controller 802 optionally determines whether to control one of more of the solid-state switches 804a, 804b, 804c, 804d as an ideal diode. The multifunctional controller 802 may determine whether to employ one or more PWM control techniques based on measurements from step 1304 (e.g., to provide charge-only or discharge-only operation), instructions from a higher level controller 822, etc. As explained above, one of more of the solid-state switches 804a, 804b, 804c, 804d may be controlled as an ideal diode (1) to prevent current flow into the battery 820 during discharge-only operation and (2) to prevent current flow out of the battery 820 during charge-only operation. If the multifunctional controller 802 determines that one of more of the solid-state switches 804a, 804b, 804c, 804d will be controlled as an ideal diode, the process 1300 proceeds to step 1312, otherwise the process 1300 proceeds to step 1314.

At step 1312, the multifunctional controller 802 determines which of the solid-state switches 804a, 804b, 804c, 804d will be controlled as an ideal diode.

At step 1314, the multifunctional controller 802 may generate one or more switch commands 808a, 808b, 808c, 808d as a function of one or measurements determined at step 1304 and, where applicable, the settings established at steps 1308 and 1312.

At step 1316, the multifunctional controller 802 may independently control each of the plurality of solid-state switches 804a, 804b, 804c, 804d to regulate power transfer between the battery pack 820 and the external bus 818. For example, the multifunctional controller 802 may communicate the switch commands 808a, 808b, 808c, 808d generated at step 1314 to the associated gate drivers 806a, 806b, 806c, 806d to selectively open and close the solid-state switches 804a, 804b, 804c, 804d.

At step 1318, the multifunctional controller 802 determines whether the process 1300 should repeat and return to step 1304, or to end at step 1320. For example, the multifunctional controller 802 may perform real-time monitoring, in which case it would be useful to repeat the process 1300 during operation.

Figure 14A:
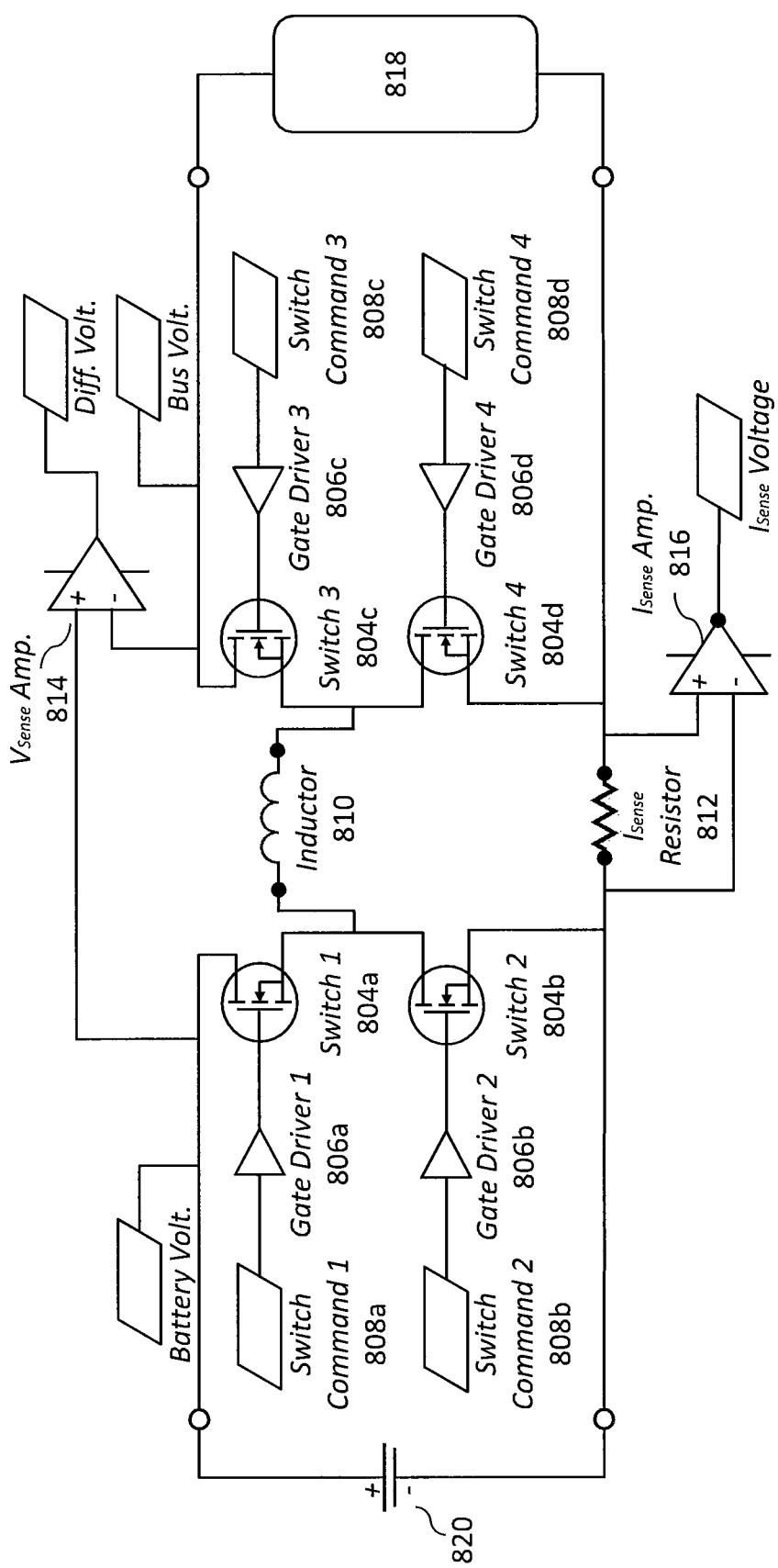
FIGS. 14a and 14b illustrate multifunction battery switches in accordance with a second and third aspect.
Figure 14B:
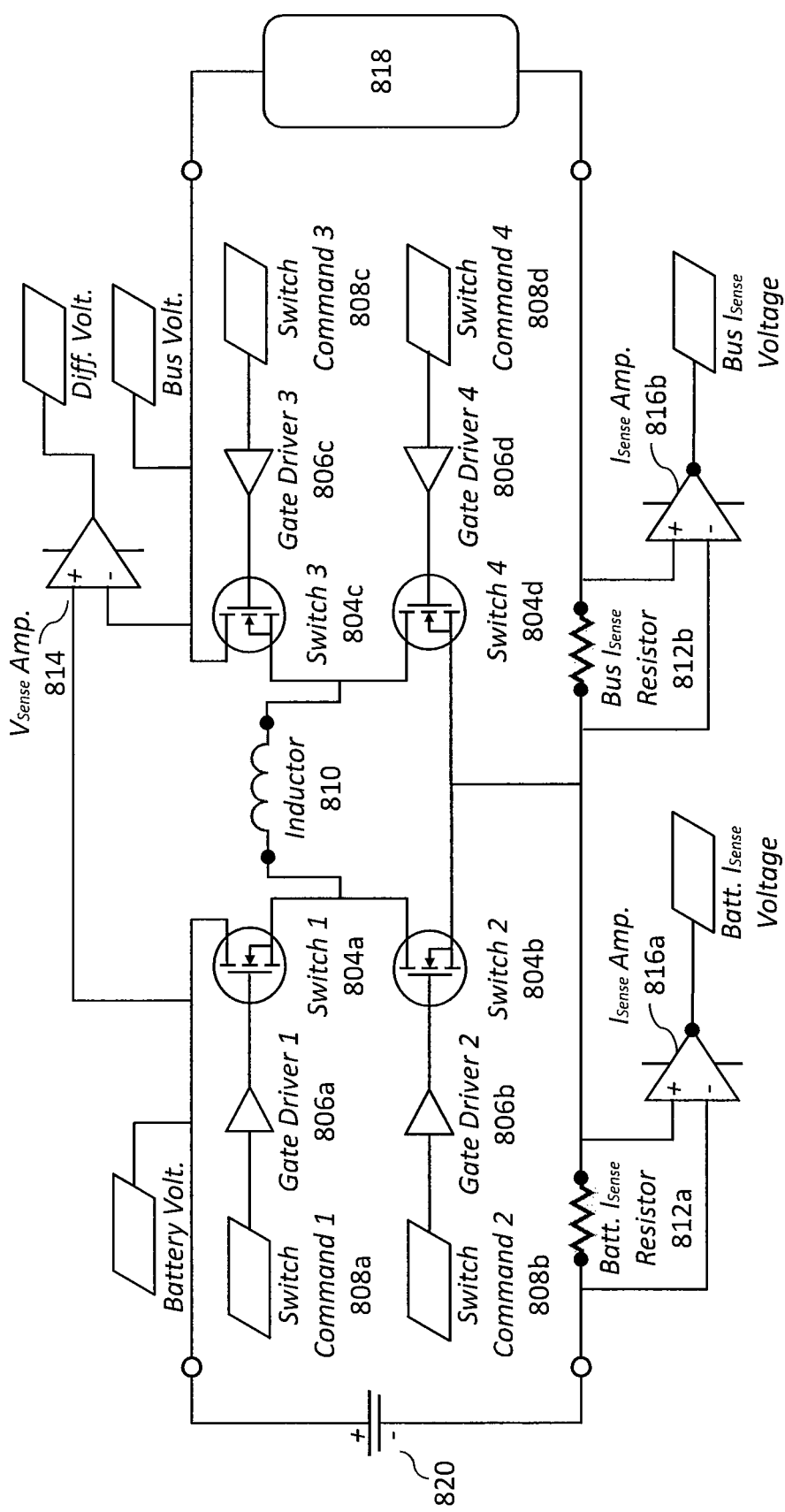

FIGS. 14a and 14b illustrate two alternative sense resistor arrangements that may be employed. FIG. 14a illustrates an arrangement where all the current flowing through switches would be sensed by a single resistor 812. This could provide more precise control during step-up or step-down operation, particularly when operating the buck-boost converter 824 in discontinuous mode. FIG. 14b illustrates an arrangement having two separate resistors 812a, 812b and two separate current-sense amplifiers 816a, 816b, which enable the system to sense current flow to and from the battery 820 independently of flow to or from the external bus 818 at the cost of an additional sense resistor, amplifier, and associated data acquisition on the multifunctional controller 802.

In certain aspects, the buck-boost switch arrangement could be simplified by eliminating two of the switches 804a, 804b, 804c, 804d, which would enable PWM current control only to decrease the voltage through the switches but not increasing it. When used with a battery 820 that is reconfigurable to vary its voltage, a 2-switch approach may offer the similar functionality at the expense of some loss of efficiency and an increase in required filtering capacitance.

While the various solar and battery power systems and methods are generally described in connection with a solar-powered aircraft, they may be applied to virtually any industry where a reconfigurable battery system is desired. In addition, the order or presentation of method steps is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the spirit and scope of this disclosure and are intended to form a part of the invention as defined by the following claims, which are to be interpreted in the broadest sense allowable by law. It will be appreciated that the methods and systems described above are set forth by way of example and not of limitation. Numerous variations, additions, omissions, and other modifications will be apparent to one of ordinary skill in the art.

What is claimed is:

1. A method for selectively connecting a battery pack to an external bus with a multifunction battery switch, the multifunction battery switch comprising a multifunctional controller operatively coupled with a plurality of switches comprising a first switch, a second switch, a third switch, and a fourth switch that are arranged with a resistor and an inductor to define a buck-boost converter, wherein the first switch and the second switch are coupled to a first terminal of the inductor and the third switch and the fourth switch are coupled to a second terminal of the inductor, the method comprising:
measuring a current through the resistor to yield a current measurement;
measuring a voltage across the battery pack to yield a battery voltage measurement;
measuring a voltage across the external bus to yield a bus voltage measurement;
calculating a differential voltage measurement between the battery voltage measurement and the bus voltage measurement;
generating, via the multifunctional controller, one or more switch commands as a function of the current measurement, the battery voltage measurement, the bus voltage measurement, and the differential voltage measurement;
independently controlling each of the plurality of switches via the switch commands to regulate power transfer between the battery pack and the external bus; and
controlling the first switch, the second switch, the third switch, and the fourth switch to operate as an ideal diode to prevent current flow into the battery pack during a discharge-only operation.

2. The method of claim 1, wherein the one or more switch commands are configured to control the plurality of switches to facilitate a charge-only operation and the discharge-only operation.

3. The method of claim 2, further comprising the step of modulating the one or more switch commands using at least one pulse width modulation (PWM) control technique to implement step-up or step-down voltage adjustments to the power transfer.

4. The method of claim 1, wherein the ideal diode is configured to prevent current flow out of the battery pack during charge-only operation.

5. The method of claim 1, wherein the battery pack is a reconfigurable battery pack having a plurality of switchable battery modules that are electrically arranged in series to define a battery string defining an output voltage, each of the plurality of switchable battery modules including a battery cell and a battery switch,
wherein the battery switch is configured to (1) electrically connect the battery cell to the battery string to increase the output voltage when the battery switch is in a first position, and (2) electrically bypass the battery cell from the battery string when the battery switch is in a second position.

6. The method of claim 5, further comprising the steps of:
generating, via the multifunctional controller, switch commands to implement fine adjustments to the output voltage of the reconfigurable battery pack via the plurality of switches; and
controlling the battery switch to implement coarse adjustments to the output voltage of the reconfigurable battery pack via the plurality of switchable battery modules.

7. A multifunction battery switch for selectively connecting a battery pack to an external bus, the multifunction battery switch comprising:
a multifunctional controller, wherein the multifunctional controller is configured to generate one or more switch commands as a function of a current measurement, a battery voltage measurement, a bus voltage measurement, and a differential voltage measurement;
a plurality of switches comprising a first switch, a second switch, a third switch, and a fourth switch, wherein each of the plurality of switches is independently controllable via one or more switch commands from the multifunctional controller, wherein the multifunctional controller is configured to control the first switch, a second switch, a third switch, and the fourth switch to operate as an ideal diode to prevent current flow into the battery pack during a discharge-only operation;
an inductor, wherein the first switch and the second switch are coupled to a first terminal of the inductor and the third switch and the fourth switch are coupled to a second terminal of the inductor; and
a resistor, wherein the inductor, the resistor, and the plurality of switches are arranged to define a buck-boost converter to selectively regulate power transfer between the battery pack and the external bus as a function of the one or more switch commands from the multifunctional controller, wherein:

the current measurement is a measured current through the resistor, the battery voltage measurement is a measured voltage across the battery pack, the bus voltage measurement is a measured voltage across the external bus, and the differential voltage is a differential voltage between the battery voltage measurement and the bus voltage measurement.

8. The multifunction battery switch of claim 7, wherein the multifunctional controller is configured to control the plurality of switches to facilitate a charge-only operation and the discharge-only operation.

9. The multifunction battery switch of claim 7, wherein the multifunctional controller is configured to control at least one of the plurality of switches using one or more pulse width modulation (PWM) control techniques to implement step-up or step-down voltage adjustments to the power transfer.

10. The multifunction battery switch of claim 7, wherein the ideal diode is configured to prevent current flow out of the battery pack during charge-only operation.

11. The multifunction battery switch of claim 7, wherein the first switch is configured to pass current between a first inductor terminal of the inductor and a first battery terminal of the battery pack and the second switch is configured to pass current between the first inductor terminal of the inductor and a second battery terminal of the battery pack.

12. The multifunction battery switch of claim 11, wherein the third switch is configured to pass current between a second inductor terminal of the inductor and a first bus terminal of the external bus and the fourth switch is configured to pass current between the second inductor terminal of the inductor and a second bus terminal of the external bus.

13. The multifunction battery switch of claim 12, further comprising an amplifier to output (1) the current measurement through the resistor or (2) a voltage measurement across the resistor.

14. The multifunction battery switch of claim 13, further comprising an amplifier to output the differential voltage measurement between (1) the battery voltage measurement across the battery pack and (2) the bus voltage measurement across the external bus.

15. The multifunction battery switch of claim 7, wherein the battery pack is a reconfigurable battery pack having a plurality of switchable battery modules that are electrically arranged in series to define a battery string having a variable output voltage.

16. The multifunction battery switch of claim 15, wherein the multifunctional controller controls the plurality of switches of the buck-boost converter to implement fine adjustments to the variable output voltage of the reconfigurable battery pack.

* * * * *